(12) United States Patent
Bard et al.

(10) Patent No.: US 9,894,807 B2
(45) Date of Patent: Feb. 13, 2018

(54) CHANGEABLE, AIRFLOW VENTING COVER ASSEMBLY FOR AN ELECTRONICS RACK

(71) Applicant: INTERNATIONAL BUSINESS MACHINES CORPORATION, Armonk, NY (US)

(72) Inventors: Seth E. Bard, Poughkeepsie, NY (US); Frank E. Bosco, Poughkeepsie, NY (US); Gary F. Goth, Pleasant Valley, NY (US); William P. Kostenko, Poughkeepsie, NY (US); Steven C. McIntosh, Kingston, NY (US); Robert K. Mullady, Poughkeepsie, NY (US); John G. Torok, Pougkeepsie, NY (US); Allan C. VanDeventer, Poughkeepsie, NY (US); Xiaojin Wei, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 84 days.

(21) Appl. No.: 14/606,118

(22) Filed: Jan. 27, 2015

(65) Prior Publication Data
US 2016/0215999 A1    Jul. 28, 2016

(51) Int. Cl.
*H05K 7/20* (2006.01)

(52) U.S. Cl.
CPC ..... *H05K 7/20736* (2013.01); *H05K 7/20181* (2013.01)

(58) Field of Classification Search
CPC ............ F24F 13/1413; H05K 7/20736; H05K 7/20181; H05K 7/20727; H05K 7/20145; H05K 7/20718

(Continued)

(56) References Cited

U.S. PATENT DOCUMENTS 5,119,270 A * 6/1992 Bolton et al. ............. G06F 1/20
                                                       165/80.3
5,297,004 A    3/1994 Mazura
(Continued)

FOREIGN PATENT DOCUMENTS

JP          02068996 A  *  3/1990
JP        2014-031974 A     2/2014

OTHER PUBLICATIONS

"Coustomer Controlled Frame Venting", submitted Anonymously, IP.com No. IPCOM000206037, IP.com Electronic Publication (Apr. 12, 2011) (3 pages).

*Primary Examiner* — Daniel J Troy
*Assistant Examiner* — Hiwot Tefera
(74) *Attorney, Agent, or Firm* — Margaret A. McNamara, Esq.; Kevin P. Radigan, Esq.; Heslin, Rothenberg, Farley & Mesiti, P.C.

(57) ABSTRACT

An apparatus is provided which includes a changeable cover assembly sized to cover, at least in part, an air outlet side of an electronics rack. The cover assembly, when positioned at the air outlet side of the rack, redirects and vents airflow egressing from the air outlet side. The cover assembly includes a frame and at least one vent cover. The frame has at least one opening through which air egressing from the electronics rack passes, and the vent cover(s) is coupled to the frame and overlies, at least in part, the opening(s) in the frame to facilitate redirecting and venting the air passing through the frame. The at least one vent cover is changeable to change a direction of the vented air. For instance, the vent cover(s) may be reversible, or otherwise adjustable or changeable, to change the direction of vented air egressing from the cover assembly.

10 Claims, 15 Drawing Sheets

(58) Field of Classification Search
USPC ........ 361/690, 692, 694–695, 831; 454/184; 211/26
See application file for complete search history.

(56) References Cited

U.S. PATENT DOCUMENTS

| | | | |
|---|---|---|---|
| 6,384,325 B1 | 5/2002 | Chastain et al. | |
| 6,494,780 B1 | 12/2002 | Norbury, Jr. | |
| 6,813,152 B2 | 11/2004 | Perazzo | |
| 6,819,563 B1 | 11/2004 | Chu et al. | |
| 7,031,154 B2 | 4/2006 | Bash et al. | |
| 7,283,358 B2 | 10/2007 | Campbell et al. | |
| 7,397,661 B2 | 7/2008 | Campbell et al. | |
| 7,646,603 B2* | 1/2010 | Bard et al. | H05K 7/20181 165/104.33 |
| 7,752,858 B2 | 7/2010 | Johnson et al. | |
| 7,872,865 B2* | 1/2011 | Matsushima et al. | G11B 33/142 165/104.33 |
| 8,154,870 B1* | 4/2012 | Czamara et al. | H05K 7/20736 361/694 |
| 8,373,987 B2* | 2/2013 | Kang et al. | G06F 1/20 181/283 |
| 8,406,012 B2* | 3/2013 | Kim | G02F 1/133382 345/205 |
| 8,555,591 B2 | 10/2013 | Yeh et al. | |
| 8,693,198 B2 | 4/2014 | Eckberg et al. | |
| 9,342,079 B2 | 5/2016 | David et al. | |
| 2002/0173265 A1* | 11/2002 | Kipka et al. | H05K 9/0041 454/184 |
| 2004/0217072 A1* | 11/2004 | Bash et al. | H05K 7/20736 211/26 |
| 2006/0176664 A1* | 8/2006 | Casebolt | H05K 7/20736 361/679.46 |
| 2008/0002358 A1* | 1/2008 | Casebolt | G06F 1/20 361/679.49 |
| 2008/0106864 A1* | 5/2008 | Merino | G06F 1/181 361/688 |
| 2009/0201640 A1* | 8/2009 | Bard et al. | H05K 7/20181 361/694 |
| 2009/0268391 A1* | 10/2009 | Matsushima et al. | G11B 33/142 361/679.49 |
| 2009/0325477 A1 | 12/2009 | Hanlon | |
| 2011/0182036 A1* | 7/2011 | Huang et al. | H05K 7/20009 361/724 |
| 2012/0162904 A1 | 6/2012 | Chan et al. | |
| 2013/0063887 A1* | 3/2013 | Wang | H05K 7/20736 361/679.48 |
| 2013/0063888 A1* | 3/2013 | Wang | H05K 7/20736 361/679.48 |
| 2013/0065501 A1* | 3/2013 | Wang | H05K 7/20181 454/184 |
| 2013/0128455 A1 | 5/2013 | Koblenz et al. | |
| 2013/0242504 A1 | 9/2013 | Cartes et al. | |
| 2014/0211419 A1* | 7/2014 | Liao | H05K 7/20727 361/695 |

* cited by examiner

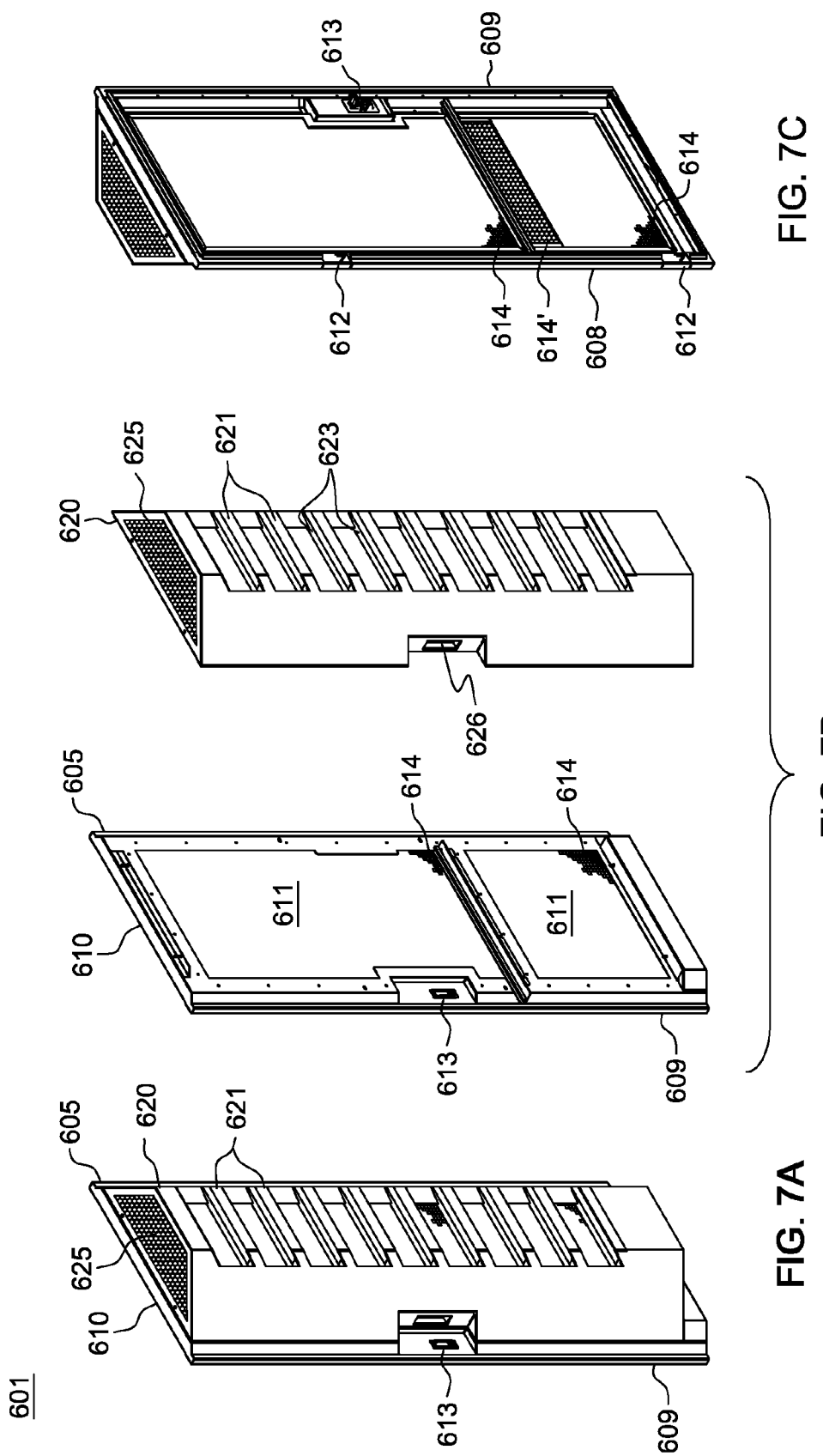

CHANGEABLE, AIRFLOW VENTING COVER ASSEMBLY FOR AN ELECTRONICS RACK

BACKGROUND

The power dissipation of integrated circuit chips, and the modules containing the chips, continues to increase in order to achieve increases in processor performance. This trend poses cooling challenges at both the rack and data center levels. Increased airflow rates are needed to effectively cool higher power components and to control the temperature of egressing air exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in airflow paths, usually front-to-back, impelled by one or more air moving devices (e.g., axial or centrifugal fans). In some cases it may be possible to handle increased power dissipation within a single drawer or subsystem by providing greater airflow, through the use of a more powerful air moving device(s) or by increasing the rotational speed (i.e., RPMs) of an existing air moving device. However, this approach may be problematic at the rack or data center level.

BRIEF SUMMARY

In one aspect, the shortcomings of the prior art are overcome and additional advantages are provided through the provision of an apparatus comprising a changeable cover assembly sized to cover, at least in part, an air outlet side of an electronics rack. The changeable cover assembly facilitates redirecting and venting airflow passing therethrough egressing from the air outlet side of the electronics rack, and includes, for instance: a frame with at least one opening through which air egressing from the air outlet side of the electronics rack passes; and at least one vent cover coupled to the frame and overlying, at least in part, the at least one opening in the frame to facilitate redirecting and venting the air passing therethrough. The at least one vent cover is changeable to change a direction of the vented air egressing from the cover assembly.

In another aspect, an apparatus is provided which includes an electronics rack and a changeable cover assembly. The electronics rack has an air inlet side and air outlet side respectively facilitating ingress and egress of air through the electronics rack. The changeable cover assembly is coupled to the electronics rack at the air outlet side thereof, and facilitates redirecting and venting airflow passing therethrough egressing from the air outlet side of the electronics rack. The changeable cover assembly includes, for instance: a frame with at least one opening through which air egressing from the air outlet side of the electronics rack passes; and at least one vent cover coupled to the frame and overlying, at least in part, the at least one opening in the frame to facilitate redirecting and venting the air passing therethrough, the at least one vent cover being changeable to change a direction of the vented air egressing from the changeable cover assembly.

In a further aspect, a method is provided which includes: providing a changeable cover assembly sized to cover, at least in part, an air outlet side of an electronics rack, the changeable cover assembly, when positioned at the air outlet side of the electronics rack, facilitating redirecting and venting airflow passing therethrough egressing from the air outlet side of the electronics rack, and the providing including, for instance: providing a frame with at least one opening through which air egressing from the air outlet side of the electronics rack passes; and providing at least one vent cover coupled to the frame and overlying, at least in part, the at least one opening in the frame to facilitate redirecting and venting the air passing therethrough, the at least one vent cover being changeable to change a direction of the vectorized air egressing from the changeable cover assembly.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A depicts a more detailed embodiment of the changeable cover assembly of FIGS. 6A and 6B, in accordance with one or more aspects of the present invention;

FIG. 7B is an exploded view of the changeable cover assembly of FIG. 7A, in accordance with one or more aspects of the present invention;

FIG. 7C depicts a frame-side view of the changeable cover assembly of FIG. 7A, illustrating in greater detail one embodiment of the frame thereof, in accordance with one or more aspects of the present invention;

DETAILED DESCRIPTION

Recent trends in addressing data center operating costs have placed increased focus on improving overall operating efficiencies, including cooling efficiencies. A significant contributor in this regard is associated with the supply of ambient cool air and the subsequent removal of egressing heated air generated within the data center's electronics racks, or information technology (IT) infrastructure. Note that electronics rack, rack unit, rack, IT infrastructure are used interchangeably herein, and unless otherwise specified, include any housing, frame, support, structure, compartment, etc. having one or more heat generated components of a computer system, electronics system, IT system, etc. Note also that reference is made below to the drawings, which are not drawn to scale to facilitate an understanding of the invention, where the same reference numbers used throughout different figures designate the same or similar components.

Figure 1:
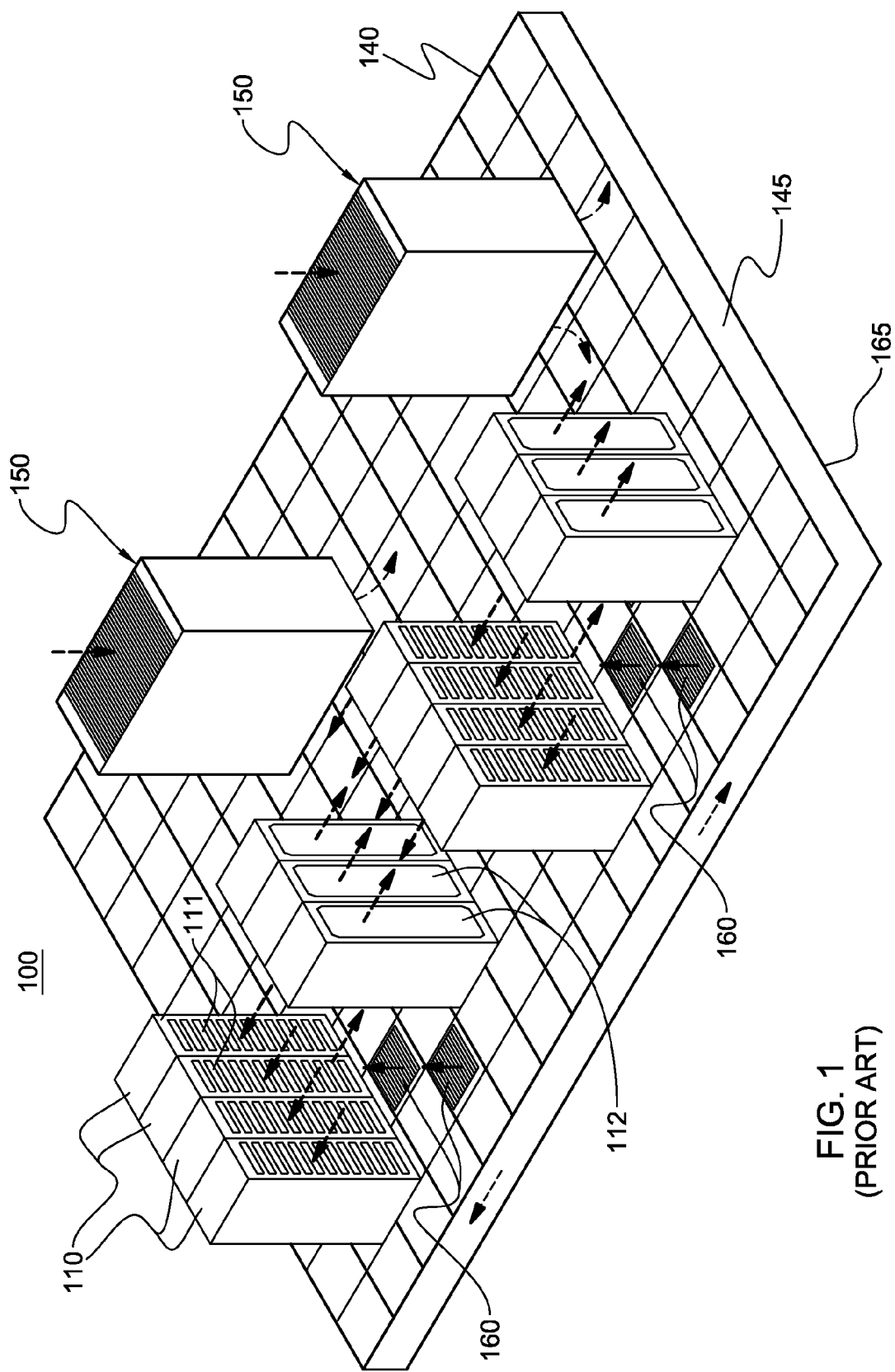
FIG. 1 depicts one embodiment of a conventional, raised-floor layout of an air-cooled data center.

By way of example, one embodiment of an air cool data center is depicted in FIG. 1. As shown, in a raised floor layout of an air-cooled data center 100, multiple electronics racks 110 may be disposed in one or more rows. A computer installation such as depicted may house several hundred, or even several thousand processors. In the arrangement of FIG. 1, chilled air enters the computer room via floor vents from a supply air plenum 145 defined between a raised floor 140 and a base or sub-floor 165 of the room. Cooled air is taken in through the front, or air inlet sides 111, of the electronics racks and expelled through the back, or air outlet sides 112, of the electronics racks. Each electronics rack 110 may have one or more air-moving devices (e.g., axial or centrifugal fans) to provide forced inlet-to-outlet airflow to cool the electronic components within the rack. Supply air plenum 145 provides conditioned and cooled air to the air-inlet sides of the electronics racks via perforated floor tiles 160 disposed (in one embodiment) in a "cold" air aisle of the data center. The conditioned and cooled air is supplied to plenum 145 by one or more air-conditioning units 150, which may also be disposed within data center 100. Room air is taken into each air-conditioning unit 150 near an upper portion thereof. In the depicted embodiment, this room air comprises in part exhausted air from the "hot" air aisles of the data center defined by opposing air outlet sides 112 of electronics racks 110.

Due to ever increasing airflow requirements through the electronics racks, and the limits of air distribution within the typical computer room installation, such as the above-described, raised-floor environment of FIG. 1, or alternatively, a non-raised-floor environment, recirculation problems within the room may occur. Recirculation can occur because the conditioned air supplied may be only a fraction of the airflow rate forced through the electronics racks by the air moving devices disposed within the racks. This can be due, for example, to limitations on diffuser flow rates. The remaining fraction of the supply of inlet side air may be made up by ambient room air through recirculation, for example, from the air outlet side of the rack unit to the air inlet side. This re-circulating flow is often very complex in nature, and can lead to significantly higher rack inlet temperatures than might be expected.

Recirculation of hot exhaust air from the hot aisle of the computer room installation to the cold aisle can be detrimental to the performance and reliability of the computer system(s), or electronic system(s), within the rack(s). Data center equipment is typically designed to operate with rack air inlet temperatures in the 15-35° C. range. For a layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to better facilitate airflow control within a data center.

Data center designers have implemented cold aisle/hot aisle layouts to compartmentalize airflow requirements within a data center. Although theoretically optimized, such an implementation has been problematic given that airflow recirculation issues may occur, and given the heterogeneous nature of installed IT or rack content within the data center. As one solution, various attempts have been made to implement cold aisle/hot aisle containment structures, such as containment barriers at the end of a cold aisle or hot aisle extending upwards, for instance, to the ceiling of the data center. Although proving to be effective, concerns remain with respect to a data center with heterogeneous IT content. For instance, IT content can vary between racks, from racks with relatively inherently low velocity horizontal air flow to those with high velocity variably directed airflow, each exiting into a hot aisle of a data center. By definition, the exiting air may be either in the same or in opposing directions, depending on the equipments' location, with the worst case scenario being when high velocity horizontal airflow from one side of a hot aisle adversely effects airflow through an opposing rack by impinging on a lower velocity airflow emanating from the opposing electronics rack, possibly negatively effecting its operational characteristics. To address these deficiencies, and to assist in both optimizing data center layouts and airflow containment designs, the ability to changeably redirect, or vectorize, airflows exiting an electronics rack into, for instance, a hot aisle of a data center, is disclosed herein in order to assist in improving control of overall data center airflow efficiency.

Figure 2:
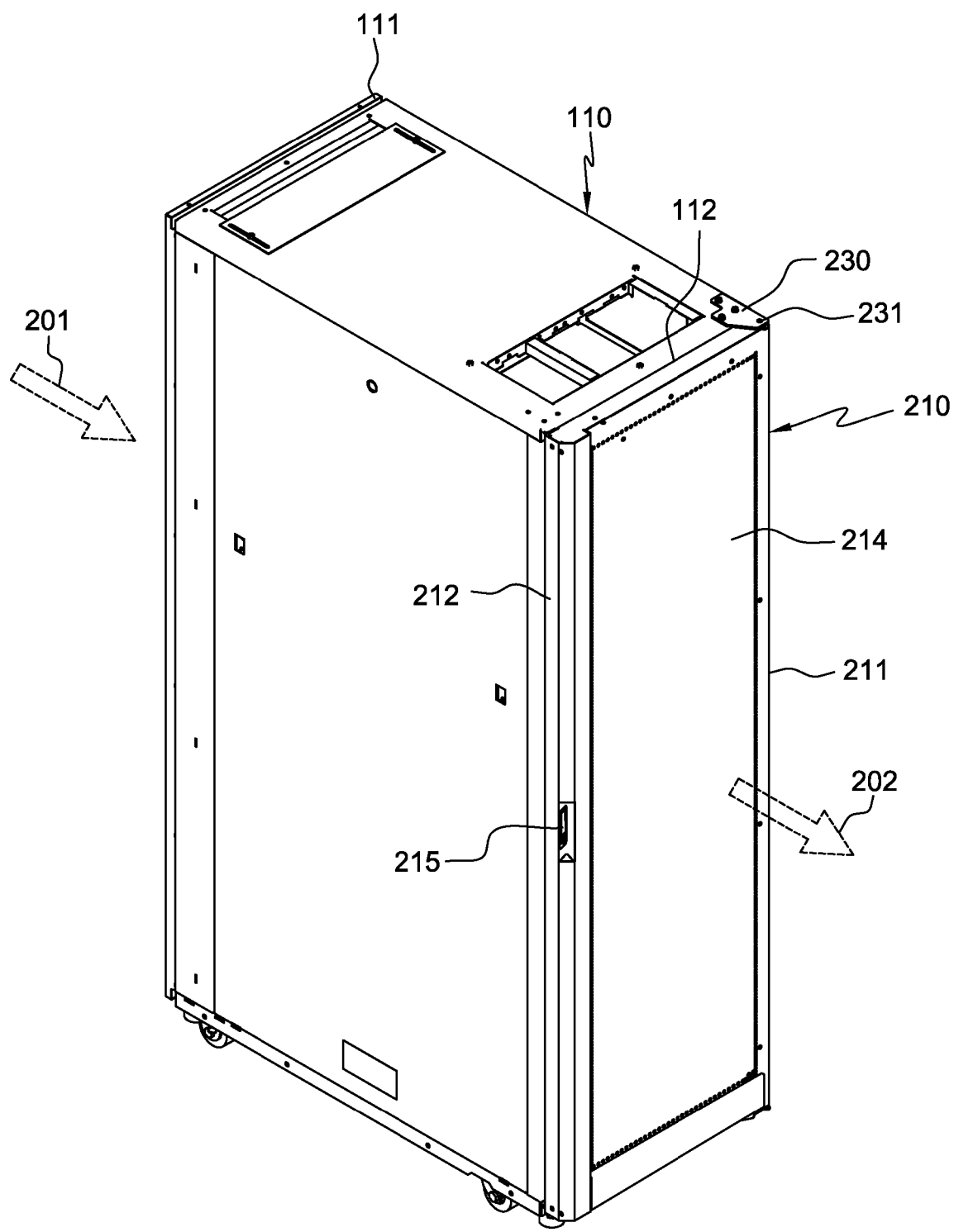
FIG. 2 depicts one embodiment of an air-cooled electronics rack, which may be fitted with a changeable cover assembly, in accordance with one or more aspects of the present invention.

FIG. 2 depicts one embodiment of an apparatus comprising an electronics rack 110 with an air exhaust door 210 mounted at a vertical hinge edge 211 to the electronics rack, for instance, at the air outlet side 112 of the electronics rack, where cool airflow 201 ingresses via air inlet side 111 of electronics rack 110 and heated exhaust air 202 egresses via air outlet side 112 thereof. In this embodiment, air exhaust door 210 is sized to substantially cover air outlet side 112 of electronics rack 110. As shown, air exhaust door 210 includes, in addition to hinge edge 211, a vertically extending latch edge 212 located opposite to hinge edge 211, and an inner side (not shown) and an outer side 214, which are opposite main sides of air exhaust door 210. In the embodiment depicted, the inner side of air exhaust door 210 is disposed closer to air outlet side 112 of electronics rack 110, with air exhaust door 210 mounted to the rack via top and bottom hinge brackets 230 and hinge pins 231 located at or adjacent to hinge edge 211 of air exhaust door 210. As illustrated, hinge pins 231 may be positioned close to outer side 214 of air exhaust door 210 so that the hinge axis is out from electronics rack 110 to, at least in part, minimize or even eliminate outward swing of air exhaust door 210 past the sides of electronics rack 110 as the air exhaust door is rotated between closed and opened positions. A door latch mechanism 215 may be disposed (in one embodiment) at or adjacent to latch edge 212, and be configured to facilitate latching of air exhaust door 210 to electronics rack 110 when in the closed position, as illustrated in FIG. 2. Perforated screens may be provided at either the inner side or the outer side 214 of air exhaust door 210, through which the heated exhaust air 202 flows laterally out.

Figure 3:
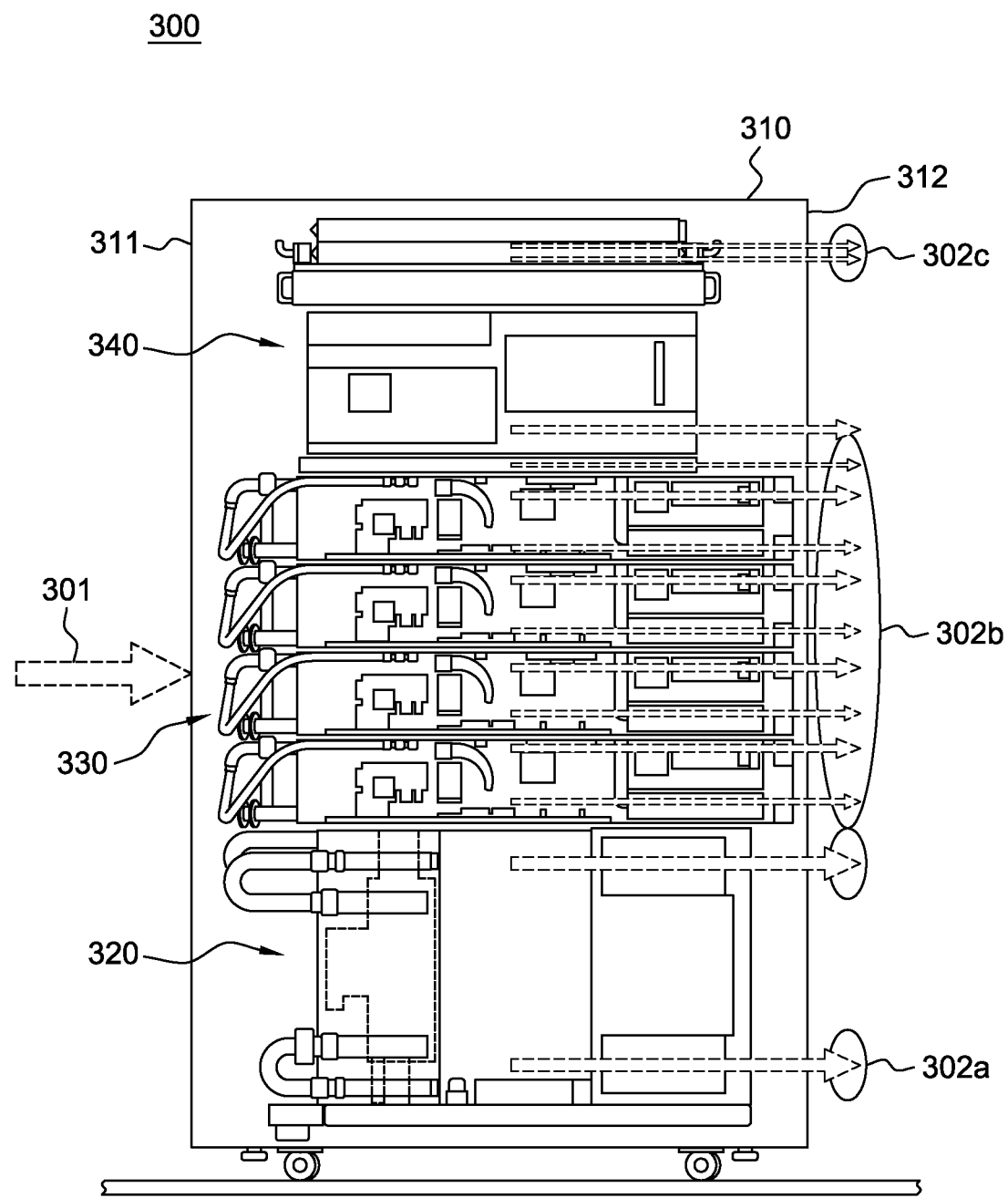
FIG. 3 is a cross-sectional, side elevational view of one embodiment of an air-cooled electronics rack to employ a changeable cover assembly, in accordance with one or more aspects of the present invention.

By way of further example, FIG. 3 depicts a more detailed embodiment of an apparatus 300 comprising an electronics rack 310, with an air inlet side 311 and an air outlet side 312 into which cool airflow 301 ingresses and heated exhaust airflow 302a, 302b, 302c egresses, respectively. As illustrated in FIG. 3, electronics rack 310 may include different electronic, IT infrastructure, components, subsystems, etc., in different regions of the rack. For instance, a lowermost region 320 may comprise a cooling subsystem with, for instance, a liquid-to-air heat exchanger or radiator, a central region 330, with one or more electronic subsystems to be cooled, such as multiple System Z® Enterprise Class™ (z EC or zEnterprise®) servers offered by International Business Machines Corporation of Armonk, N.Y., USA, and an uppermost region 340, with, for instance, input/output systems for electronics rack 310. As illustrated by the different number and differently sized airflow arrows through the rack 310, the different regions 320, 330 & 340 may have different egressing airflow 302a, 302b, 302c characteristics at air outlet side 312 of electronics rack 310. For instance, in one example, lowermost region 320 and middle region 340 may have localized, higher temperature, higher velocity airflow exhaust than, for example, uppermost region 340. Note that differently manufactured electronics racks, or different generations of the same electronics rack, may have significantly different rack-level airflow patterns due to different heterogeneous or mixed flow characteristics of the racks' contents.

Given the unique airflow requirements of different electronics racks from, for instance, different manufactures, or from the same manufacture, but different generations, the primary airflow direction through the electronics rack, and the primary direction of air egress from the electronics racks may differ with, for instance, some designs providing a straight-through egress of airflow as depicted in FIG. 3 and other designs establishing, for instance, a downward airflow egress direction. The result is an observed uncontrollable, non-uniform distribution of exhaust airflow into the data center, with localized higher temperatures, as well as regions of higher velocity exhaust airflow, that together raise significant potential customer issues due to the data center cooling impact of the non-uniform, non-controllable nature of the airflow distribution.

Generally stated, disclosed herein therefore is an apparatus and method of fabrication which includes a changeable cover assembly sized to cover, at least in part, an air outlet side of an electronics rack. The changeable cover assembly is designed or configured to facilitate redirecting or vectorizing airflow passing therethrough egressing from the air outlet side of the electronics rack. The redirecting, or vectorizing, of the airflow includes, for instance, redirecting at least a portion of the airflow egressing from the air outlet side of the electronics rack to a desired, non-horizontal exhaust orientation.

The changeable cover assembly includes, for instance, a frame with at least one opening through which air egressing from the air outlet side of the electronics rack passes, and at least one vent cover coupled to the frame and overlying, at least in part, the at least one opening in the frame to facilitate redirecting and venting the air passing through the changeable cover assembly. The at least one vent cover is designed to be changeable or reconfigurable to allow changing of the direction of vented air egressing from the changeable cover assembly. For instance, the vent cover(s) may be configured to be reversible relative to the frame in order to allow a technician to change the direction of the vented air. In one implementation, the vent cover(s) includes multiple fixed louvers having, at least in part, a common orientation relative to the frame. Reversing of the direction of the vented air may include, for instance, turning upside down one or more vent covers of the assembly to change the direction of the vented air egressing from the changeable cover assembly. Note that, in certain embodiments, the changeable cover assembly may be sized to fully or substantially cover the air outlet side of the electronics rack.

In certain implementations, the vent cover(s) may include multiple adjustable louvers which facilitate redirecting or vectorizing the air passing through the opening(s) in the frame. The multiple adjustable louvers may have, at least in part, a common adjustable orientation relative to the frame, and may be manually or automatically adjustable, for instance, via a controller or control system coupled to the multiple adjustable louvers. The control system may be disposed, for instance, within the electronics rack, or elsewhere within the data center housing the rack. In certain implementations, the control system may automatically adjust the common orientation of the multiple adjustable louvers based on one or more sensed parameters associated with, for instance, the electronics rack or the data center housing the electronics rack. The one or more sensed parameters may be, for example, one or more sensed temperatures or power levels, as explained further below.

In one implementation, the changeable cover assembly may include multiple vent covers coupled to the frame and overlying the one or more openings in the frame to redirect or vectorize the air passing therethrough. In these implementations, the at least one vent cover is a vent cover(s) of the multiple vent covers. By way of example, the at least one vent cover may be reversible relative to the frame to selectively change the direction of the vented air egressing from that section of the changeable cover assembly. In another example, two or more vent covers of the multiple vent covers may be differently configured to facilitate differently redirecting the air passing therethrough in different directions. In certain implementations, two or more of the vent covers may be differently sized, with one or more of the vent covers being changeable to change the direction of the vented air. For instance, one vent cover could define one or more fixed air exhaust channels relative to the frame, and the other could have changeable air exhaust channels. In another embodiment, each vent cover of the multiple vent covers could receive a respective percentage of the air passing through the at least one opening in the frame, and each may be changeable to independently change the direction of the vented air egressing therefrom.

In one or more other implementations, the frame and the at least one vent cover may define at least one air exhaust plenum at the air outlet side of the electronics rack, with the at least one air exhaust plenum redirecting air egressing from the air outlet side of the electronics rack by, for instance, substantially 90° to exit upwards, perpendicular to an upper surface of the electronics rack, or downwards, perpendicular to a lower surface of the electronics rack. By way of further example, the frame and the vent cover(s) may define multiple air exhaust plenums at the air outlet side of the electronics rack, with the multiple air exhaust plenums each redirecting a portion of the air egressing from the air outlet side of the electronics rack by substantially 90°. In these configurations, the vent cover may be changeable by reversing the vent cover, so as to change the direction of egressing airflow from the one or more air exhaust plenums, or may be changeable by changing the vent cover used in the changeable cover assembly by, for instance, coupling a different vent cover to the frame of the changeable cover assembly, which defines a different configuration of the one or more air exhaust plenums defined by the changeable cover assembly.

In one or more implementations, the cover assembly may further include at least one electromagnetic compatibility (EMC) screen, for instance, within the at least one opening of the frame, such that the at least one vent cover overlies the at least one EMC screen. As noted, the cover assembly may be sized to substantially cover the air outlet side of the electronics rack, and the frame may be a door frame hingedly mountable to the electronics rack at the air outlet side thereof. Additionally, in one or more implementations, an acoustically-absorptive material may be associated with the at least one vent cover, for instance, disposed on inner surfaces thereof, and be selected to attenuate noise emanating from the electronics rack through the at least one opening in the frame when the cover assembly is coupled to the air outlet side of the electronics rack.

Advantageously, disclosed herein are various changeable cover assembly designs for, for instance, the air outlet side of an electronics rack. The changeable cover assemblies disclosed controllably redirect or vectorize air egressing from the electronics rack in a desired manner for a particular data center implementation, and/or for a particular electronics rack design. In one or more implementations, a fixed louver, reversible vent cover design is disclosed, wherein airflow can be directed, for instance, either at an upward angle or a downward angle relative to horizontal, as selected by the data center operator. Selecting a downward air flow direction may enable commonality with certain legacy rack systems, while reducing the downward airflow for a push pull system upgrade due to downwardly directed airflow. Selecting an upward airflow direction may enable airflow optimization within a data center that has a hot aisle containment construction. Multi-piece, changeable cover assembly designs are presented herein, which facilitate addressing human factor requirements, for instance, with respect to single-person assembly lift weight recommendations. Further, a sectional vent cover approach may be employed to address human factor requirements with respect to single person lift weight recommendations on the vent cover itself. For instance, the concepts disclosed herein may be executed with a single-piece, or multi-piece, fixed or variable louver design. Alternatively, a variable or adjustable louver design could be manually, or automatically, implemented, for instance, via server feedback control based on environmental operating parameters. The changeable cover assembly approach disclosed herein may be extended, in one or more embodiments, to a chimney-type form to redirect airflow into, for instance, a data center's return air plenum located above, or even below the electronics rack.

Figure 4A:
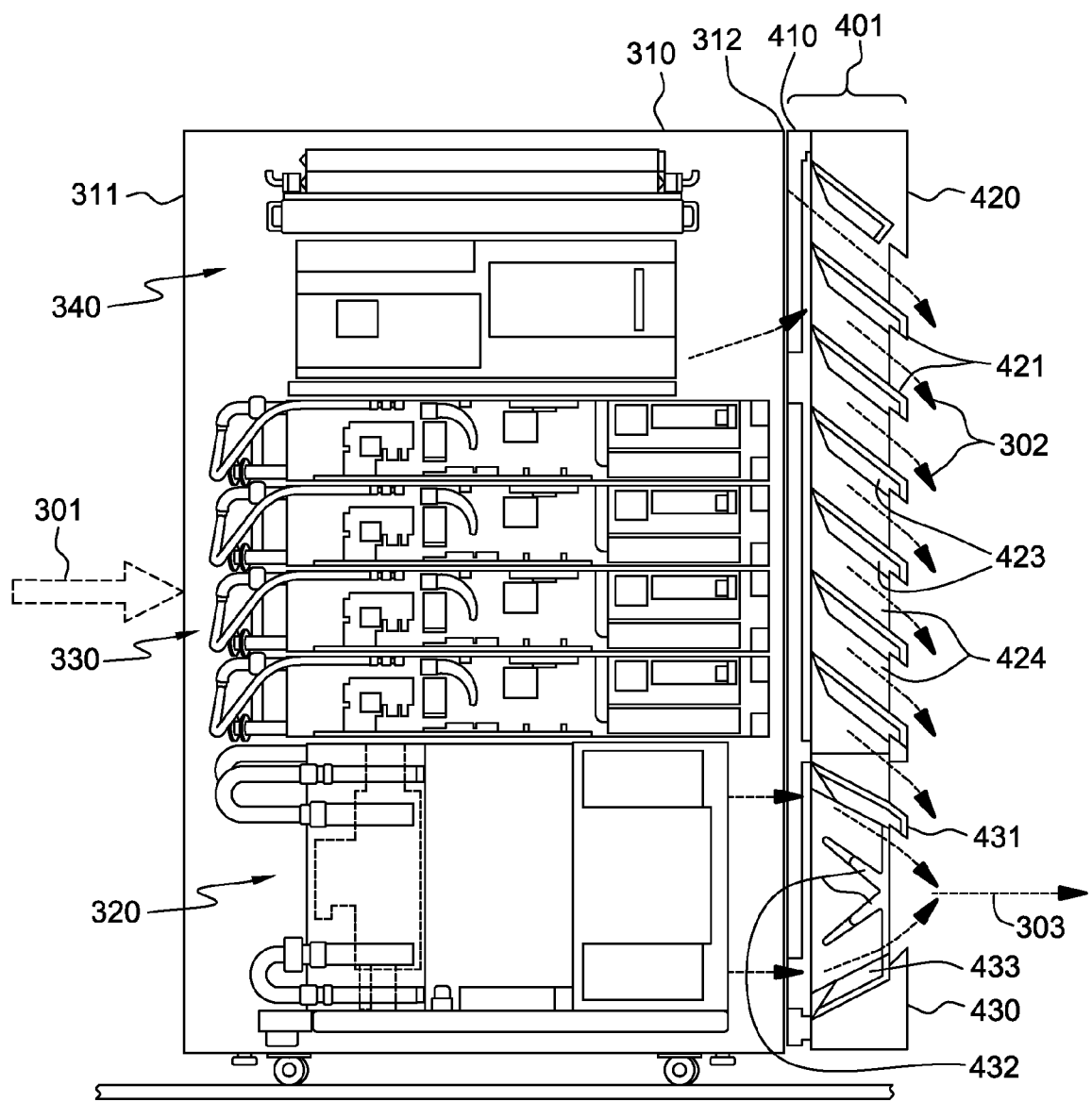
FIG. 4A is a cross-sectional, side elevational view of an apparatus comprising the air-cooled electronics rack of FIG. 3, and a changeable cover assembly disposed at the air outlet side thereof, in accordance with one or more aspects of the present invention.

FIGS. 4A-10C depict various examples of the above-summarized aspects of the present invention. Referring initially to FIGS. 4A & 4B, wherein one embodiment of an apparatus 400 is shown comprising a changeable cover assembly 401 coupled to an air outlet side 312 of electronics rack 310, such as the above-described electronics rack 310 of FIG. 3. In the embodiment depicted in FIGS. 4A & 4B, changeable cover assembly 401 is sized and configured by way of example to fully or substantially cover air outlet side 312 of electronics rack 310, such that substantially all air egressing from electronics rack 310 passes through changeable cover assembly 401. Thus, in one embodiment, cover assembly 401 has substantially the same height and width as electronics rack 310 at air outlet size 312 thereof.

Figure 4B:
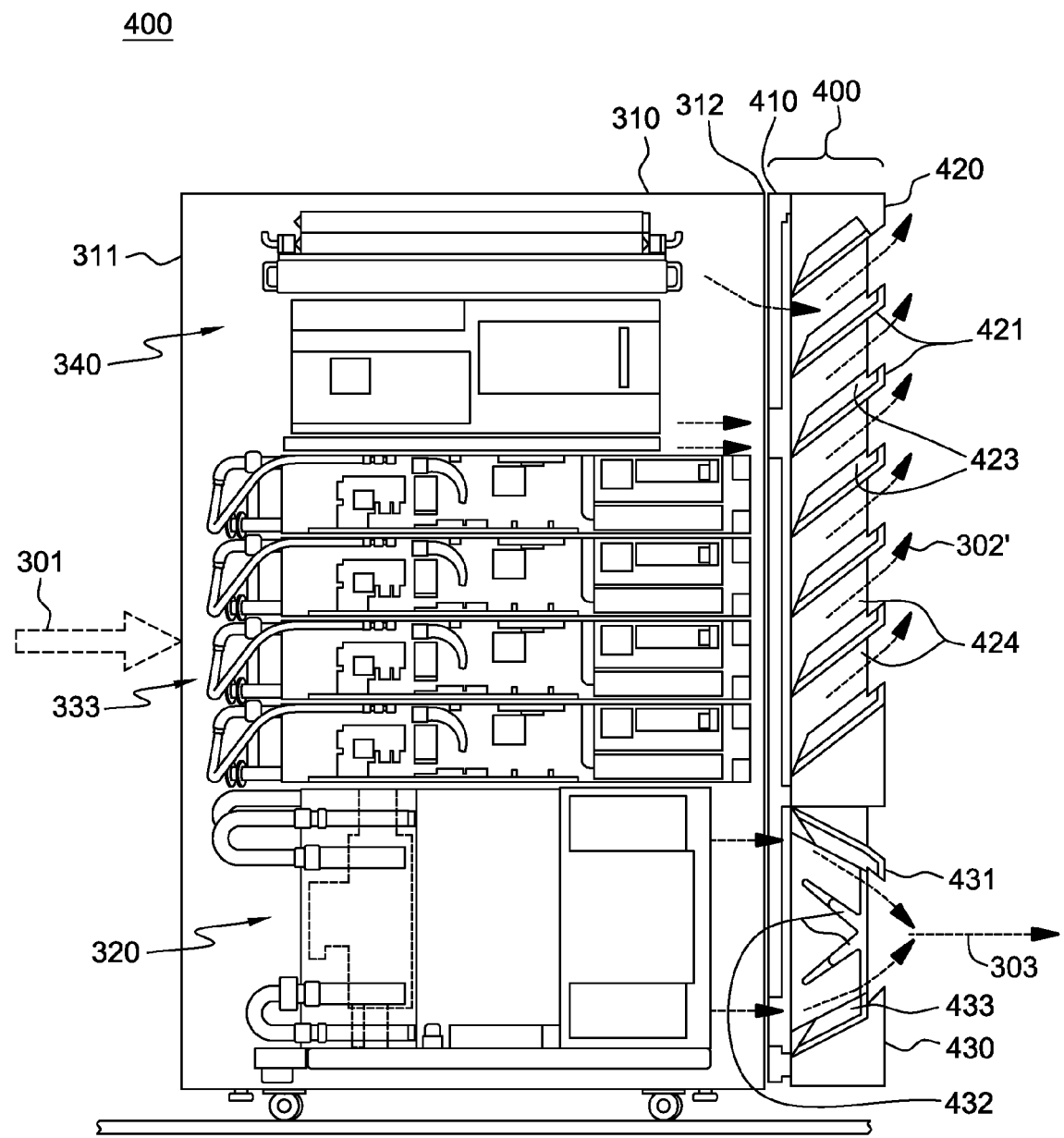
FIG. 4B is a cross-sectional, side elevational view of the apparatus of FIG. 4A, with one or more vent covers of the changeable cover assembly shown reversed, in accordance with one or more aspects of the present invention.

In the implementation of FIGS. 4A & 4B, changeable cover assembly 401 includes a frame 410 and multiple vent covers 420, 430 overlying one or more openings (not shown) in frame 410. Airflow egressing from air outlet side 312 of electronic rack 310 passes through the one or more openings in frame 410, and is redirected or vectorized into multiple airflow channels or pathways through the vent covers 420, 430. Note that FIGS. 4A & 4B depict a two-vent cover implementation, but that in other embodiments, three or more vent covers could be coupled together, and to frame 410 to define changeable cover assembly 401. In the two-vent cover example of FIGS. 4A & 4B, upper vent cover 420 may be reversible, as illustrated in FIGS. 4A & 4B, with vent cover 430 being fixed (that is, in one example). By way of example only, vent cover 420 includes multiple fixed louvers 421, which in FIG. 4A, are oriented at an approximate 40° angle downwards from horizontal, and in FIG. 4B, are angled approximately 40° upwards from horizontal, that is, when the vent cover 420 is reversed by flipping the vent cover upside-down. Note that the 40° angle of the louvers is presented by way of example only. Various angles may be implemented in combination with a changeable cooling assembly such as described herein, for instance, in order to optimize the assembly's application to the particular IT content of the electronics rack. Note also that in three dimensions, vent covers 420, 430 may have various shapes, such as trapezoidal, rhombus, rectangular, curvilinear, semispherical, etc., as desired for a particular application to define the desired airflow channels or pathways. Note further that, airflow egressing from different regions of the air outlet side of the electronics rack may be isolated and separately directed by the changeable cover assembly 401, for instance, through the configuration of frame 410 and the use of different vent covers 420, 430.

In the embodiment depicted in FIGS. 4A & 4B, vent covers 420, 430 each include respective fixed louvers 421, 431. The multiple fixed louvers 421 of vent cover 420 are disposed substantially parallel and spaced so as to define parallel airflow channels 424, through which egressing airflow 302 is vented in substantially parallel airflow paths, in a downward manner in the configuration of FIG. 4A, and when reversed, in an upward manner, as illustrated in FIG. 4B. In one embodiment, fixed louvers 421 may comprise one or more surfaces with acoustic material 423 coupled thereto. The acoustic material is a noise-reducing material which is selected and positioned to attenuate noise emanating from the electronics rack, through the one or more openings in the frame of the changeable cover assembly, that is, when the cover assembly is operatively coupled to the electronics rack, as illustrated in FIGS. 4A & 4B. In this manner, the changeable cover assembly 401 may comprise a changeable acoustic cover assembly for the electronics rack.

By way of further example, vent cover 430 is configured with airflow channels defined between respective airflow structures 431, 432, which together direct egressing airflow 303 in different directions so as to intersect upon being vented from the cover assembly, for instance, to reduce momentum of the egressing airflow upon leaving apparatus 400, with the resulting exiting exhaust air 303 being substantially horizontally directed. Note that this particular configuration of vent cover 430 is presented by way of example only, and may be advantageously employed to optimize, for instance, radiator efficiency in a specific system design such as depicted in FIG. 3, wherein the lowermost region 320 includes a radiator of the cooling system. As with vent cover 420, one or more surfaces of vent cover 430 may have acoustic material 433 coupled thereto to attenuate noise emanating from the electronics rack.

Note that FIGS. 4A & 4B are provided as one example only of a changeable cover assembly, in accordance with one or more aspects of the present invention. In this cover assembly implementation, the assembly is changeable, and in particular, vent cover 420 is changeable, by being configured to allow for the vent cover to be readily reversed, such that a data center operator may control whether for a particular rack or for a particular location within the data center, exhausting airflow from the electronics rack is directed downwards or upwards. Depending upon the electronics rack implementation, and desired egressing airflow control, various numbers of vent covers and various configurations of vent covers may be provided and combined. Note that coupling of the vent cover(s) to the frame of the changeable cover assembly may be accomplished using a variety of approaches. In one approach, gravity via fixed mounting pins may be used. Alternatively, one or more fasteners may be employed, particularly for use within a data center within a high seismic activity region.

Figure 5:
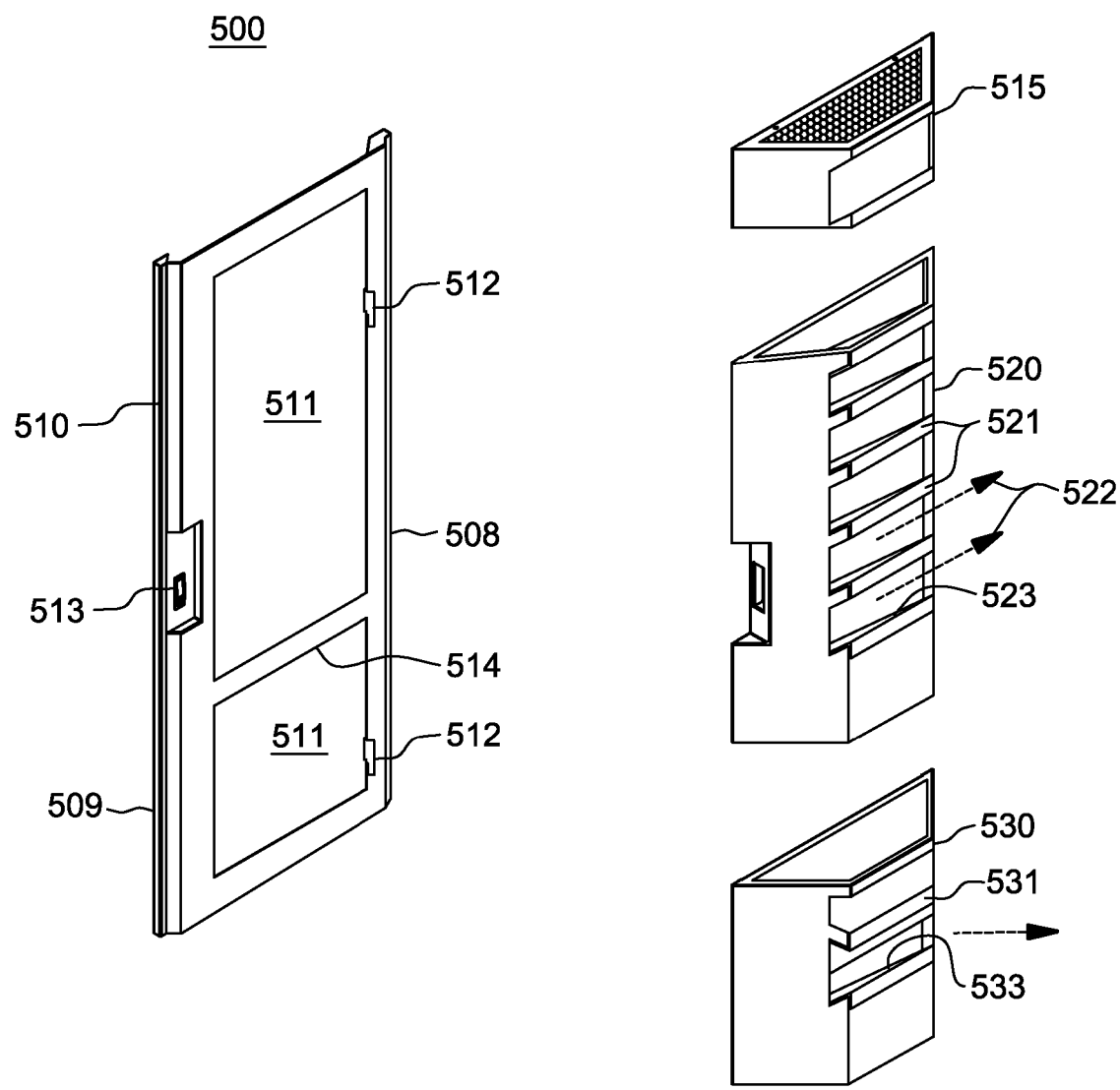
FIG. 5 is an exploded view of one embodiment of a changeable cover assembly, in accordance with one or more aspects of the present invention.

By way of further example, FIG. 5 depicts a changeable cover assembly 500 implemented as a door assembly to be hingedly mounted to, for instance, an air outlet side of an electronics rack, such as electronics rack 310 described above in connection with FIG. 3. In this configuration, cover assembly 500 includes a frame 510, designed as a door frame with one or more openings 511 through which air egressing from an air outlet side of an electronics rack passes when changeable cover assembly 500 is hingedly mounted to the electronics rack. By way of example, frame 510 may be sized with a height and width substantially matching a height and width of the air outlet side of the electronics rack model to which the frame is to be hingedly mounted. Hinges 512 may be provided along a hinge edge 508 of frame 510, and a door latch mechanism 513 may be disposed (in one embodiment) adjacent to a latch edge 509 of frame 510, which is opposite to hinge edge 508 of frame 510. Latch mechanism 513 is configured to facilitate latching of frame 510 to the respective electronics rack when in closed position. One or more perforated screens (not shown) may be provided within the one or more openings 511 of frame 510. For instance, one or more electromagnetic compatibility (EMC) screens (not shown) may be provided to attenuate electromagnetic noise. Note that frame 510 may include one or more crossbars 514 for enhanced frame rigidity, as well as to provide one or more surfaces for vent covers of changeable cover assembly 500 to seal to in order, for instance, to separate or isolate air egressing from a lowermost region of the associated electronics rack from, for example, a central or uppermost region of the electronics rack. In this manner, different airflow zones at the air outlet side of the electronics rack may be separately handled by the changeable cover assembly 500.

As illustrated, changeable cover assembly 500 further includes multiple vent covers 515, 520 & 530, which may be differently configured, as illustrated. The number and particular configuration of each vent cover 515, 520, 530 may be tailored to airflow characteristics of a particular type of electronics rack, or a particular manufacturer's rack design. That is, depending upon the component IT content within the rack, different egressing airflow characteristics may be obtained from the lower to the upper regions of the one or more openings 511 in frame 510. In the example illustrated, upper vent cover 515 may be configured as a cap, and allow for lateral egress of exhaust airflow, while vent cover 520 may include multiple fixed louvers 521 defining multiple substantially parallel airflow channels therethrough. In this configuration, vent cover 520 is reversible, such that egressing airflow 522 through vent cover 520 may be directed either upwards (as shown), or downwards, upon upsidedown reversal of the vent cover. Vent cover 530 may be similar to vent cover 430 described above in connection with FIGS. 4A & 4B, and be provided to align to, for instance, a radiator section of an electronics rack in a lowermost region of the rack. Vent cover 530 may include one or more airflow-directing structures 531 which direct egressing airflow substantially laterally outward by mixing airflow from two or more airflow channels, in a manner similar to that described above in connection with FIGS. 4A & 4B. One or more of the surfaces of vent covers 415, 420, 430 may include acoustically absorptive material 523, 533, as desired to, for instance, attenuate noise emanating from the electronics rack through the air outlet side of the electronics rack.

With vent covers 515, 520, 530 configured as depicted in FIG. 5, vent cover 530 in the lowermost region of the door assembly may be, for instance, integrated or permanently affixed to frame 510 so as to overlie the lowermost opening 511 in the frame and seal to frame 510 and crossbar 514 to separate airflow egressing from the lowermost region of the associated electronics rack from airflow egressing from the central and uppermost regions of the electronics rack when changeable cover assembly 500 is hingedly mounted to the air outlet side of the electronics rack. Further, as noted, vent cover 520 may be configured to be reversible relative to the frame to allow, for instance, a data center operator to change a direction of vented air egressing from at least a portion of the cover assembly by, for instance, flipping the vent cover 520 upside-down in order to direct the egressing airflow either upward or downward, depending on the orientation of louvers 521 of vent cover 520. Note that in one implementation, upper vent cover 515 could be attached to middle vent cover 520 prior to coupling of the vent covers 515, 520 to frame 510.

Figure 6A:
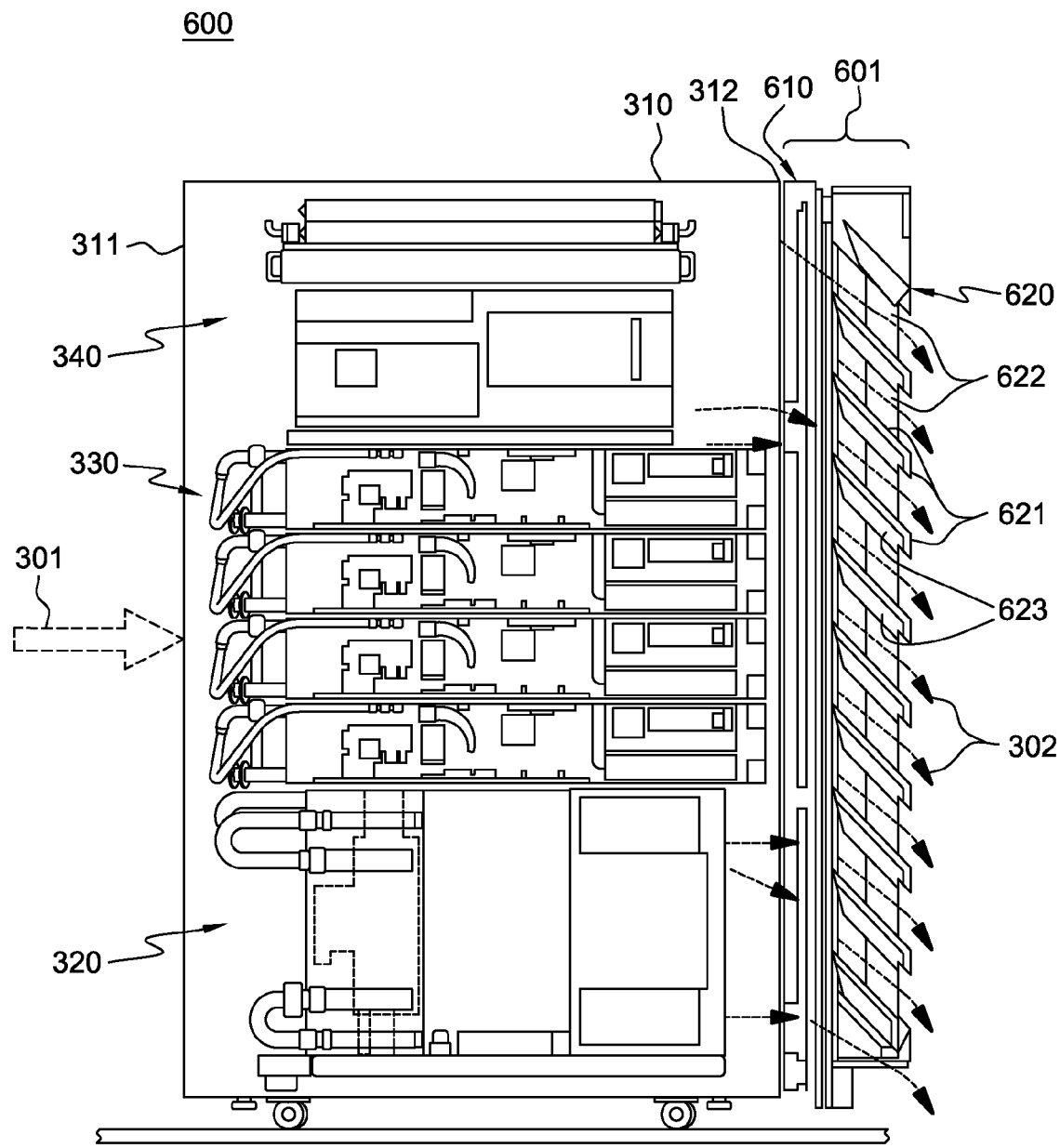
FIG. 6A is a cross-sectional, elevational view of an apparatus comprising the air-cooled electronics rack of FIG. 3, and another embodiment of a changeable cover assembly disposed at the air outlet side thereof, in accordance with one or more aspects of the present invention.
Figure 6B:
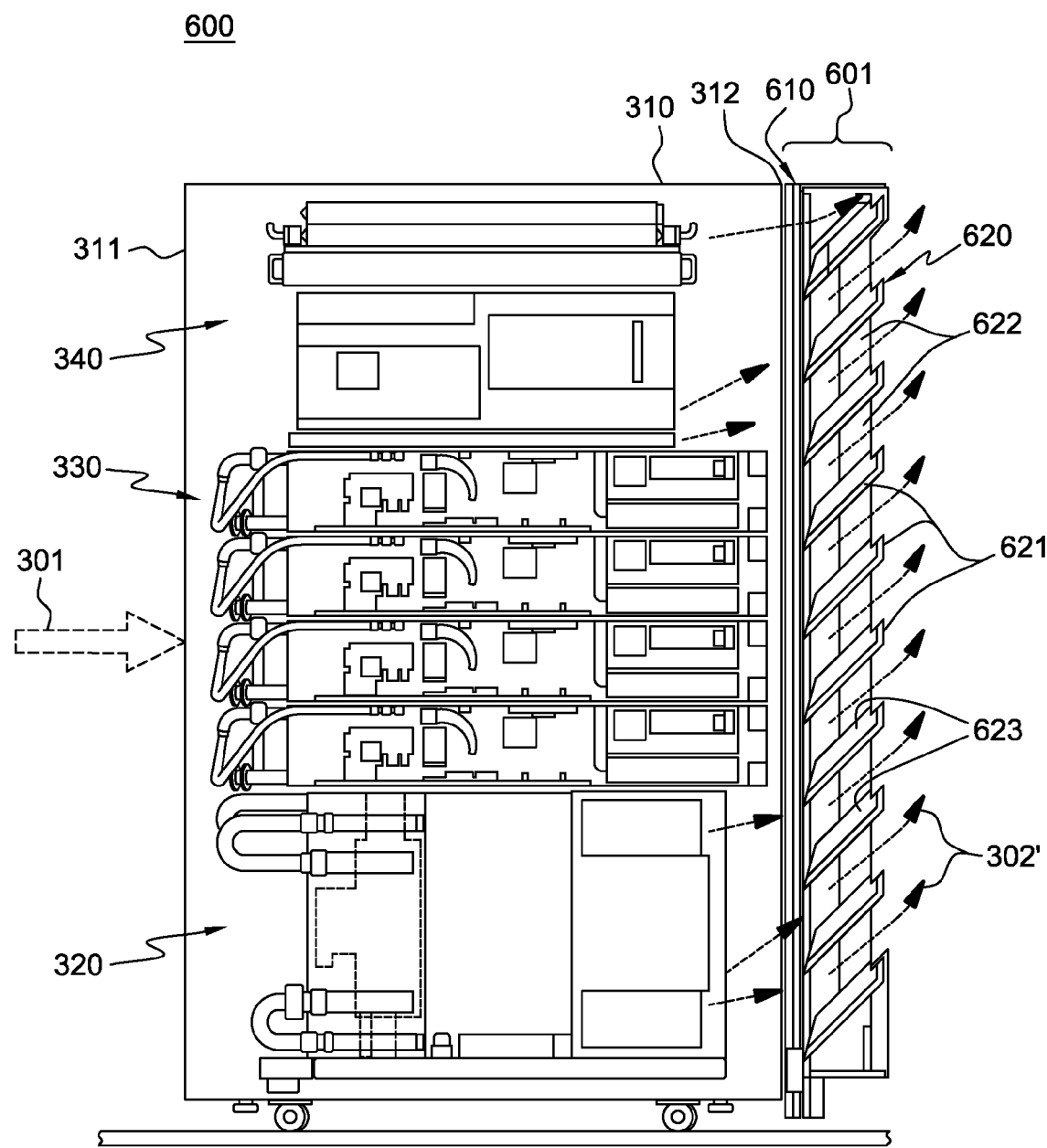
FIG. 6B depicts the apparatus of FIG. 6A, with the vent cover of the changeable cover assembly shown reversed, in accordance with one or more aspects of the present invention.

FIGS. 6A & 6B depict an alternate embodiment of an apparatus 600 comprising an electronics rack 310, such as described above in connection with FIG. 3, and a changeable cover assembly 601, in accordance with one or more aspects of the present invention. In one implementation, cover assembly 601 could be secured via one or more fasteners (not shown) to air outlet side 312 of electronics rack 310 in order for substantially all air egressing from the air outlet side of the electronics rack to pass therethrough. Alternatively, changeable cover assembly 601 could be configured as a changeable cover assembly door configured to mount to electronics rack 310 and be rotatable between an opened position (not shown) and a closed position, illustrated by way of example in FIGS. 6A & 6B. In the illustrated configuration, changeable cover assembly 601 includes a frame 610, designed with one or more openings (not shown) through which air egressing from the air outlet side of electronics rack 310 passes when the frame 610 of changeable cover assembly 601 is mounted to electronics rack 310. As illustrated, the height and width of frame 610 may be sized to substantially match a height and width of the air outlet side of electronics rack 310 to which frame 610 is mounted. If configured as a door assembly, hinges (not shown) may be provided along a hinge edge of frame 610, and a door latch mechanism (not shown) may be disposed along an opposite latch edge of frame 610, in a manner similar to that described above in connection with the embodiment of FIG. 5. One or more perforated screens (not shown) may be provided within the one or more openings in frame 610. For instance, one or more electromagnetic compatibility (EMC) screens (not shown) may be provided within the one or more openings in frame 610 to attenuate electromagnetic noise.

Changeable cover assembly 601 further includes a vent cover 620, which is reversible and has a plurality of louvers 621 oriented, at least in part, in a common direction from, for instance, horizontal. By way of specific example, the multiple louvers 621 could be oriented at approximately 40° angle from horizontal, with the angle being depicted downward in FIG. 6A, and upward in FIG. 6B, depending on the particular orientation of vent cover 620. As illustrated, multiple parallel airflow channels 622 are defined between louvers 621 of vent cover 620 in order to facilitate redirecting and venting airflow 302 egressing from air outlet side 312 of electronics rack 310 in a desired direction, that is, downward or upward, depending (for instance) on the location of electronics rack 310 within a data center and/or depending upon the particular air-cooling configuration of the data center, as to whether downward or upward redirecting, or vectorizing, of airflow 302 is desired. As with the prior embodiments, one or more surfaces of the changeable cover assembly 601, and in particular of the vent cover 620, may include acoustically-absorptive material 623 as desired, to attenuate noise emanating from the electronics rack through the air outlet side of the electronics rack. By way of example, one or more surfaces of louvers 621 may include the acoustically-absorptive material 623. In one implementation, vent cover 620 may be secured via fasteners to frame 610, or via other mechanical coupling approaches. If desired, frame 610 may include one or more crossbars (not shown) to which reversible vent cover 620 may seal to, for instance, to maintain separate airflow egressing from one or more regions of electronics rack 310 from one or more other regions of the electronics rack. By way of example, airflow egressing from the lowermost region 320 of electronics rack 310 could be segregated from airflow egressing from the central and/or uppermost 330, 340 regions of electronics rack 310.

By way of further explanation, FIGS. 7A-7C depict in greater detail one embodiment of the changeable cover assembly 601 of FIGS. 6A & 6B.

Referring collectively to FIGS. 7A-7C, in one or more embodiments, changeable cover assembly 601 may be implemented as a door assembly to be hingedly mounted to, for instance, air outlet side 312 of electronics rack 310 of FIGS. 6A & 6B. In this configuration, changeable cover assembly 601 includes frame 610, designed as a door frame with one or more openings 611 through which air egressing from the air outlet side of the electronics rack passes when changeable cover assembly 601 is hingedly mounted to the electronics rack. That is, frame 610 may be sized with a height and a width substantially matching the height and width of the air outlet side of the electronics rack model to which the frame is to be hingedly mounted.

Hinges 612 may be provided along a hinge edge 608 of frame 610, and a door latch mechanism 613 may be disposed (in one embodiment) adjacent to a latch edge 609 of frame 610, which is opposite to hinge edge 608 of frame 610. Latch mechanism 613 may be configured to facilitate latching of frame 610 to the electronics rack when in closed position, and to allow pivotable opening of the changeable cover assembly 601 when desired, for instance, to access the air outlet side of the electronics rack. One or more perforated screens 614 may be provided within the opening(s) 611 of frame 610. For instance, one or more electromagnetic compatibility (EMC) screens 614 may be provided to attenuate electromagnetic noise associated with the electronics rack.

Further, one or more localized, perforated brackets 614' may be provided within one or more openings 611 of changeable door assembly 601 in order to add localized airflow impedance to further customize airflow balance through the changeable door assembly where desired. The localized, perforated bracket 614' may allow for a lower airflow rate through that region compared with, for instance, the airflow rate through an adjacent region of the respective opening 611 having only perforated screen 614.

Reversible vent cover 620 may be reversibly mounted to frame 610 using, for instance, one or more mechanical fasteners, or other mechanical coupling means. In FIGS. 7A & 7B, louvers 621 of vent cover 620 are illustrated (by way of example only) in an upward orientation, similar to that depicted in FIG. 6B. Perforated panels 625 may be provided at the upper surface and lower surface of reversible vent cover 620 to, for instance, minimize airflow impedance at the upper and lower regions of the reversible vent cover 620.

As discussed in connection with FIGS. 6A & 6B, the multiple louvers 621 may be, in one embodiment, multiple fixed louvers, which facilitate redirecting and venting of air passing through opening(s) 611 in frame 610 so as to, for instance, vectorize the egressing air into multiple parallel airflow paths with a substantially common orientation, such as either upward or downward relative to horizontal, as described above in connection with FIGS. 6A & 6B. For instance, depending upon the location of the associated electronics rack within the data center, or the particular airflow configuration of the data center, it may be desirable for an operator to customize the airflow egressing from the electronics rack by orienting the reversible vent cover in a manner for the airflow to egress at an upward angle relative to horizontal, or at a downward angle relative to horizontal. In addition, and as noted, one or more surfaces of vent cover 620 may include acoustically-absorptive material 623 to facilitate attenuating noise emanating from the electronics rack through the air outlet side of the electronics rack.

Figure 8A:
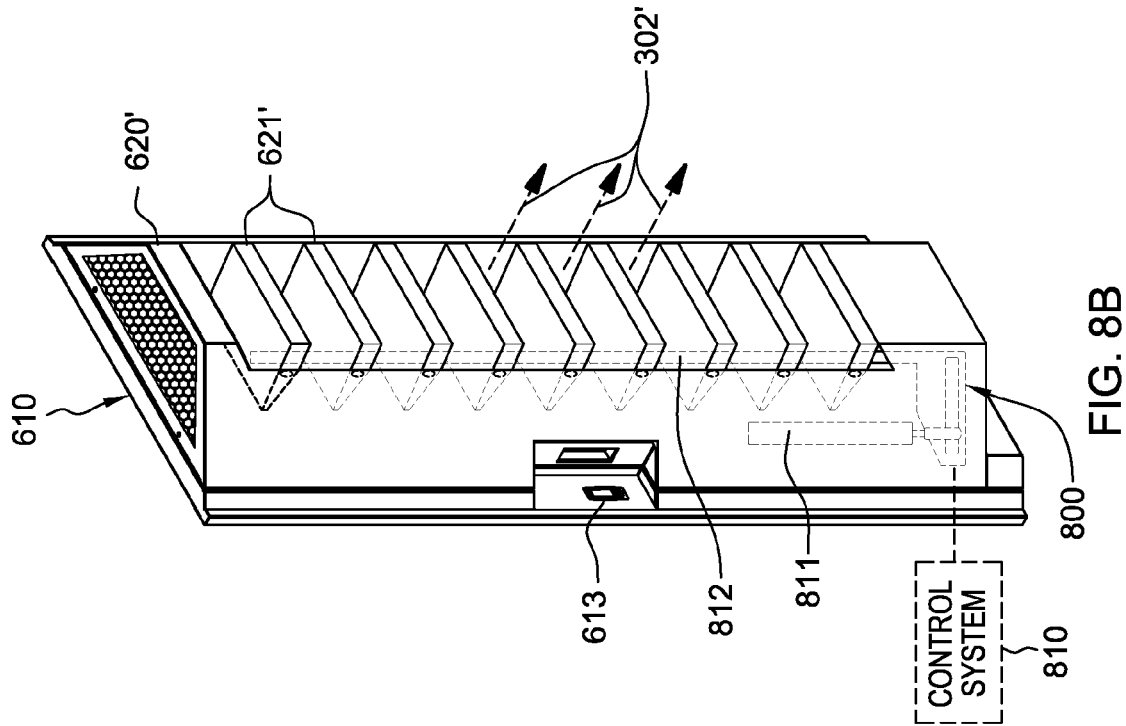
FIG. 8A depicts an alternate embodiment of a changeable cover assembly for an air outlet side of an air-cooled electronics rack, with multiple adjustable louvers of the vent cover shown depicted at a first orientation, in accordance with one or more aspects of the present invention.
Figure 8B:
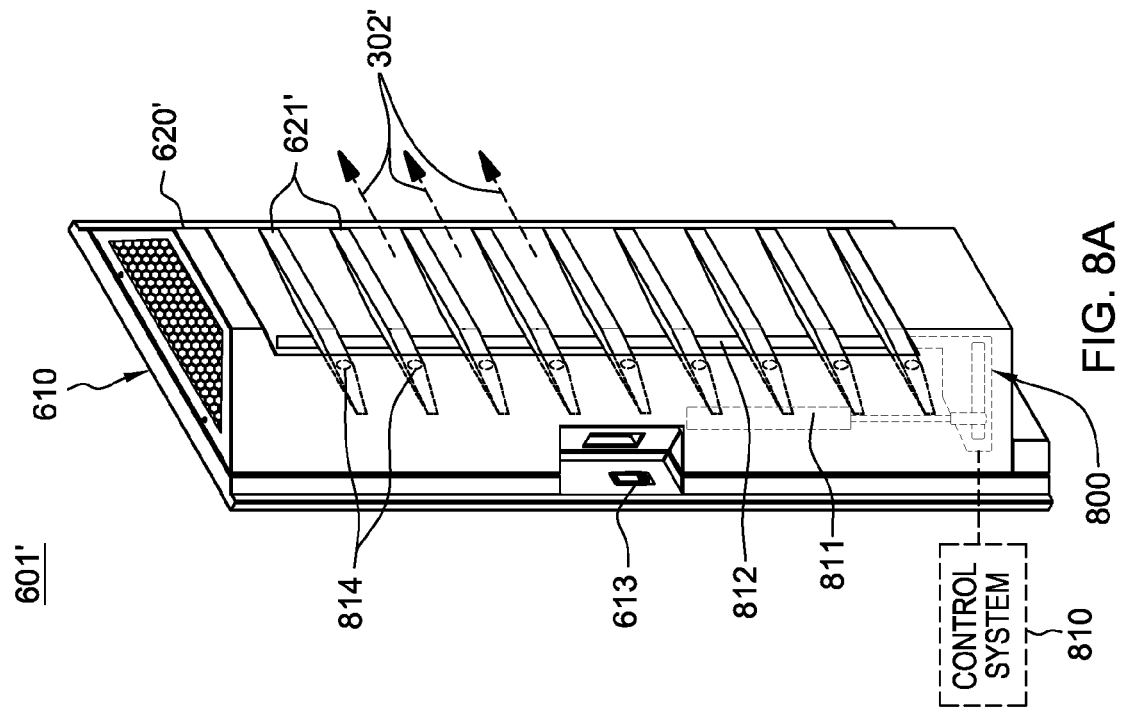
FIG. 8B depicts the changeable cover assembly of FIG. 8A, with the multiple adjustable louvers thereof depicted transitioned to a second orientation, in accordance with one or more aspects of the present invention.

FIGS. 8A & 8B depict a further variation on the changeable cover assembly 601 of FIGS. 7A-7C, wherein the changeable cover assembly 601' includes multiple moveable or adjustable louvers 621' within vent cover 620'. In one or more implementations, changeable cover assembly 601' is similar to changeable cover assembly 601 of FIGS. 7A-7C, including having a frame 610 configured and sized to hingedly mount to an air outlet side of the electronics rack. In such an embodiment, latch mechanism 613 may be provided to facilitate latching of frame 610 to the respective electronics rack when in closed position.

As illustrated in FIGS. 8A & 8B, in one embodiment, the multiple adjustable louvers 621' may be collectively adjusted upward or downward, relative to horizontal, in order to change the direction of airflow 302' egressing from the changeable cover assembly 601'. Multiple adjustable louvers 621' facilitate redirecting and venting of the airflow passing through the one or more openings in frame 610 and have, at least in part, a common, adjustable orientation relative to the frame, or relative to horizontal, where the frame is assumed to be vertically coupled to an air outlet side of an electronics rack. The louvers could be manually adjusted by, for instance, allowing an operator access to an actuator bar 812 coupled to the adjustable louvers 621'. Alternatively, an automatic adjustment system 800 may be coupled to adjustment louvers 621', and include, for instance, a control system 810, an actuator 811, one or more moveable coupling linkages, and one or more actuator bars 812, coupling movement of actuator 811 to the multiple adjustable louvers 621' under control of control system 810. In this manner, control system 810 may be configured or programmed to dynamically or periodically adjust orientation of the multiple adjustable louvers 621' based on one or more sensed parameters associated with the electronics rack to which changeable cover assembly 601' is mounted, or associated with, for instance, the data center housing the electronics rack. For instance, orientation of the multiple adjustable louvers 621' may be automatically controlled in order to adjust the redirecting of airflow 302' egressing from the changeable cover assembly in a manner best suited for the current conditions within the electronics rack or data center housing the electronics rack.

In one implementation, adjustable louvers 621' may each have respective hinge points or pins 814 within vent cover 620', about which the louvers pivot, depending on the position of one or more actuator bars 812. In one implementation, actuator 811 is an actuator cylinder, however, different forms of actuators could be employed in a changeable cover assembly 601' such as described herein. For instance, linear or rotary actuators could alternatively be used, as well as other forms of linkages. Automatic, individual control of each adjustable louver 621' could, in one embodiment, be implemented by one skilled in the art using a rotary-type actuator. Note that, in one or more implementations, control system 810 could be implemented within the associated electronics rack, or could reside at another location within the data center housing the electronics rack.

Figure 9A:
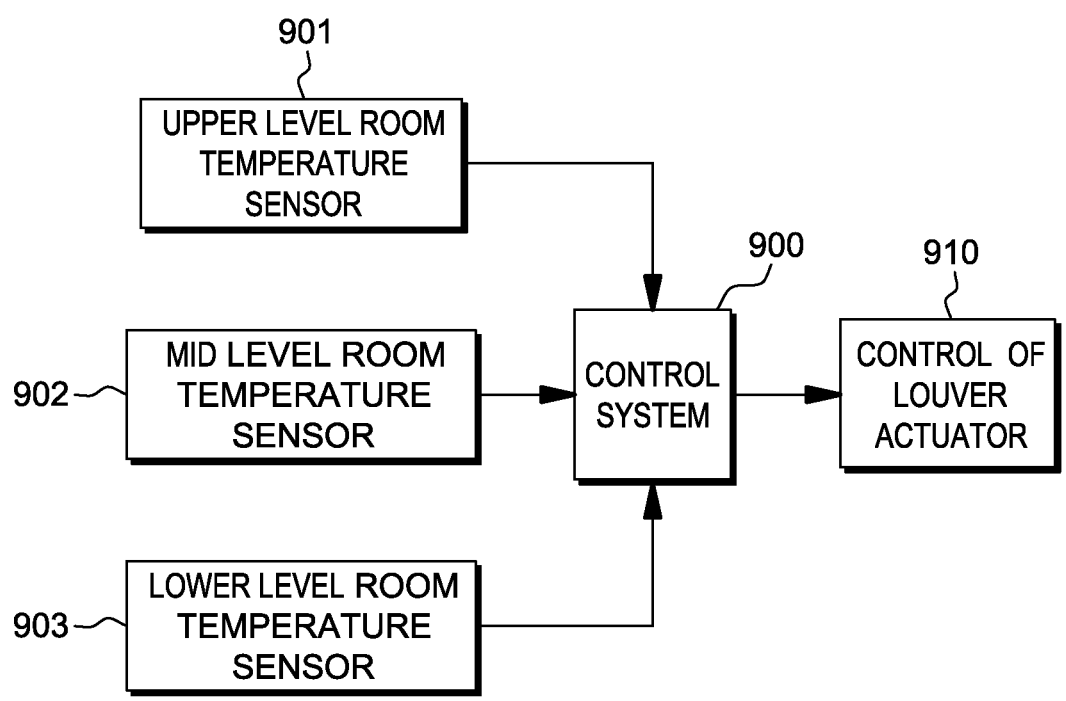
FIG. 9A depicts one embodiment of a process for automatically controlling the adjustable louver orientation within a changeable cover assembly such as depicted in FIGS. 8A & 8B, in accordance with one or more aspects of the present invention.
Figure 9B:
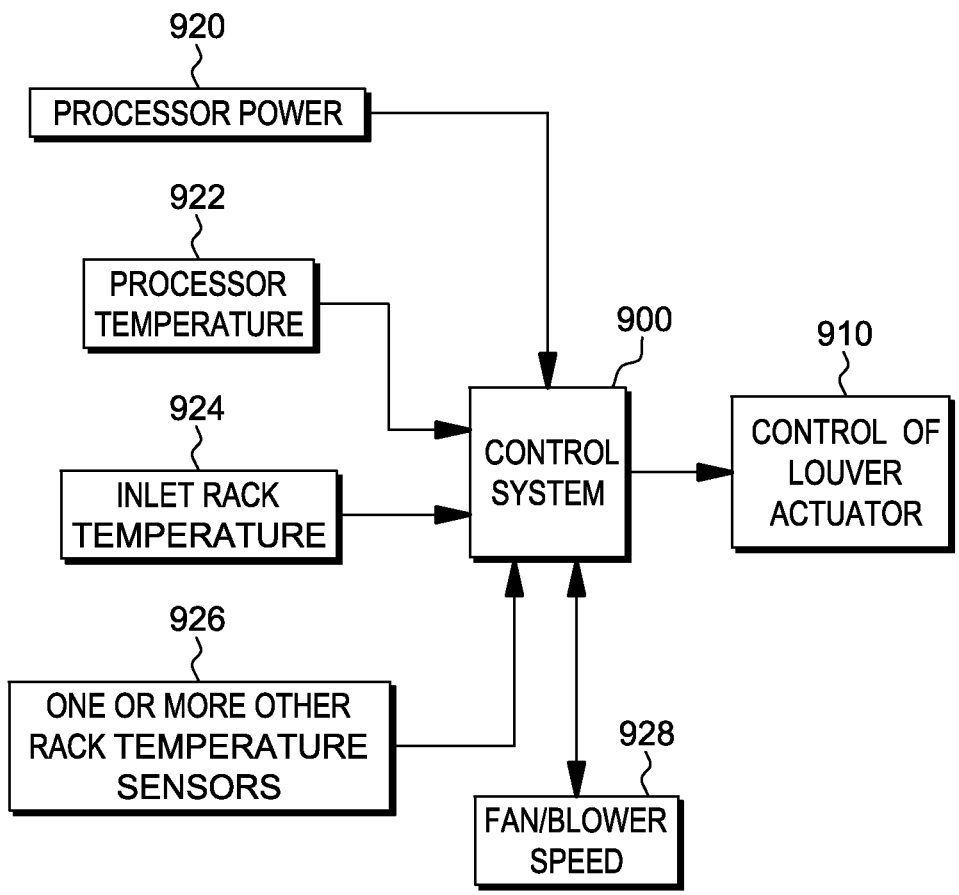
FIG. 9B depicts another embodiment of a process for automatically controlling the adjustable louver orientation within a changeable cover assembly such as depicted in FIGS. 8A & 8B, in accordance with one or more aspects of the present invention.

FIGS. 9A & 9B depict two examples of control processes which could be programmed into control system 810 of a changeable cover assembly 601', such as depicted in FIGS. 8A & 8B.

Referring first to FIG. 9A, in one embodiment, the control system processing 900 receives as input multiple sensed temperatures, including, for instance, an upper-level room temperature, a mid-level room temperature, and a lower-level room temperature, from upper-level room temperature sensor 901, mid-level room temperature sensor 902, and lower-level room temperature sensor 903. Depending on the implementation, multiple temperature sensors may be provided at each of the different levels within the data center, or may be disposed, for instance, at different regions of the data center, or different regions of the associated electronics rack. The control system 900, which in one embodiment may be a power thermal control system, may be programmed to adjust the adjustable louver orientations based on one or more predetermined set points. The particular set point(s) will vary by facility, depending on the room air-conditioning system and specific system layouts of the data center floor. Once determined, the control system 900 controls the louver actuator(s) 910, to collectively or separately adjust the multiple adjustable louvers dependent, for example, on the values of the sensed parameters.

FIG. 9B depicts an alternate control process, wherein the control system process 900 monitors the system environment and workload of the associated electronics rack to, for instance, obtain a maximum acoustic attenuation, based on predetermined reliability temperature limits. For instance, the control system may initially control fan/blower speed 928 until a preset lower limit is reached. If the temperature reliability limits have not been reached, the louvers can then be actuated via control of the louver actuator 910 to close the louvers to further improve acoustic performance to the system. Closing of the louvers could entail orienting louvers in a more downward position or a more upward position, dependent, for instance, on the room air-conditioning system and rack layout of the data center. In this control implementation, control system process 900 may receive sensed parameters, such as processor power 920, processor temperature 922, inlet rack temperature 924, and one or more other rack temperatures via one or more other rack temperature sensors 926. The sensed parameter information may be employed by the control system process 900 being configured or programmed to automatically adjust fan/blower speed 928 and/or control the louver actuator 910, to (for instance) balance airflow recirculation with noise attenuation within the data center.

Figure 10A:
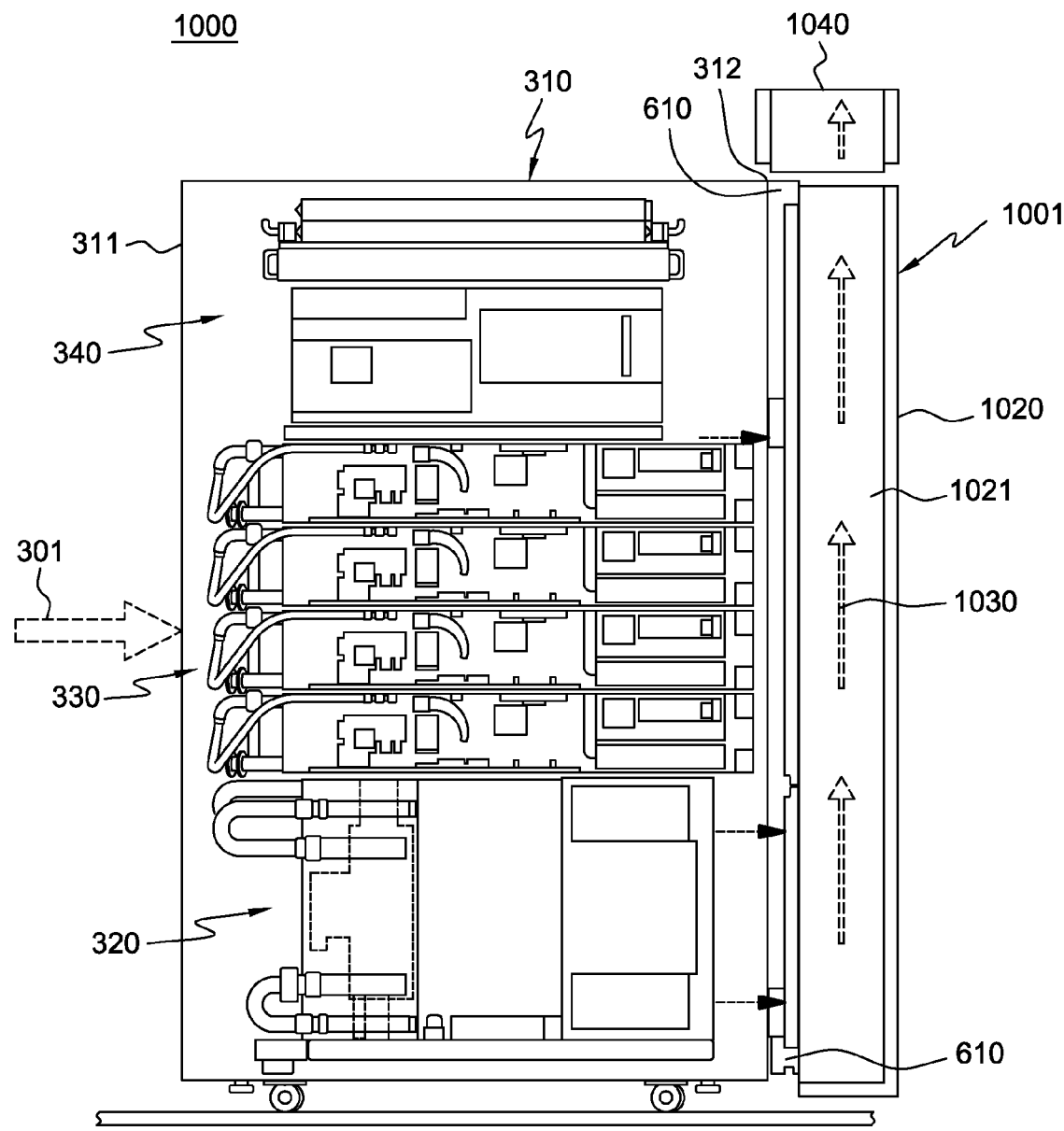
FIG. 10A depicts one embodiment of an apparatus comprising the air-cooled electronics rack of FIG. 3, and another embodiment of a changeable cover assembly, shown coupled to the air-outlet side of the electronics rack, in accordance with one or more aspects of the present invention.
Figure 10B:
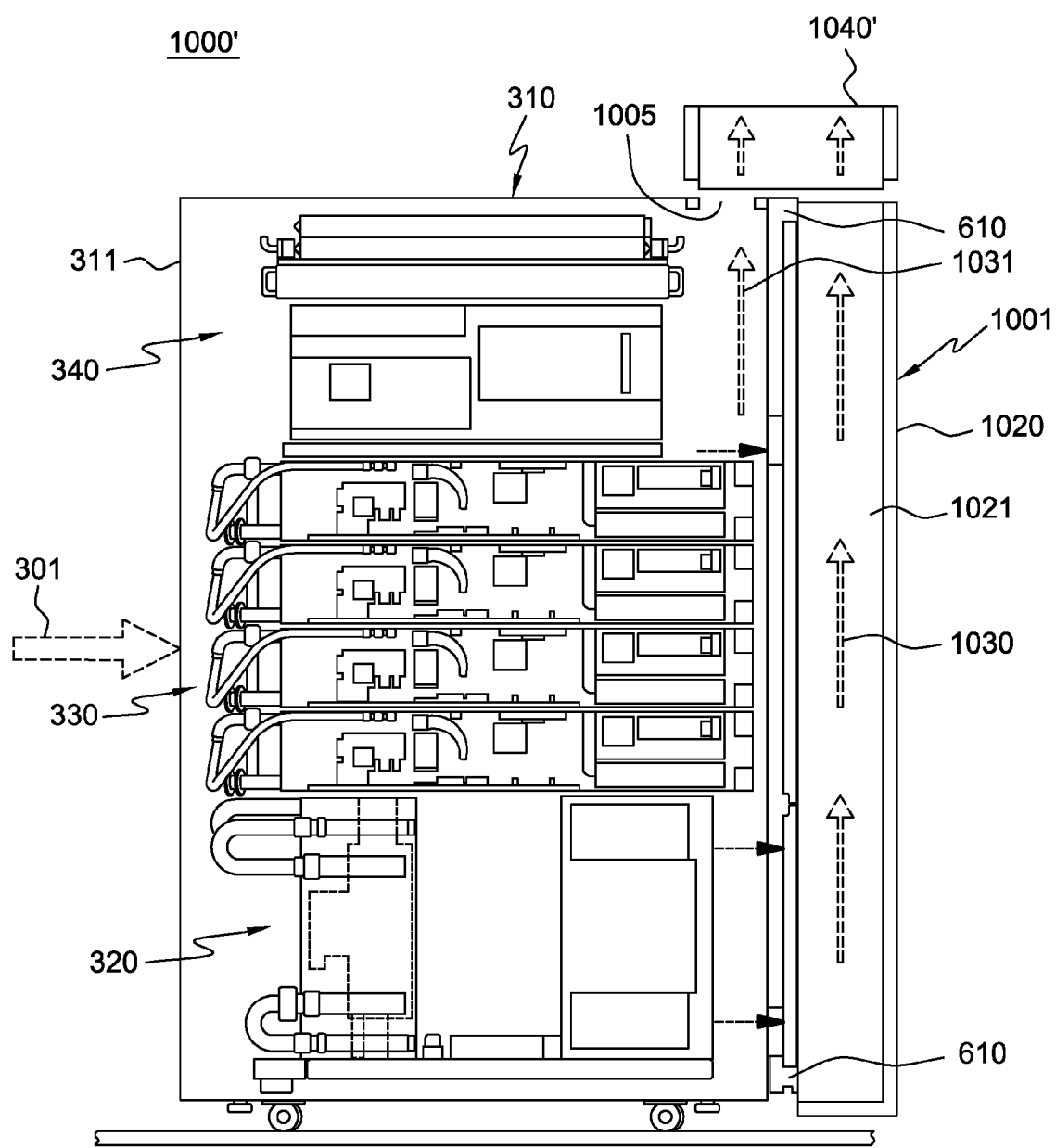
FIG. 10B depicts an alternate embodiment of the apparatus of FIG. 10A, in accordance with one or more aspects of the present invention.
Figure 10C:
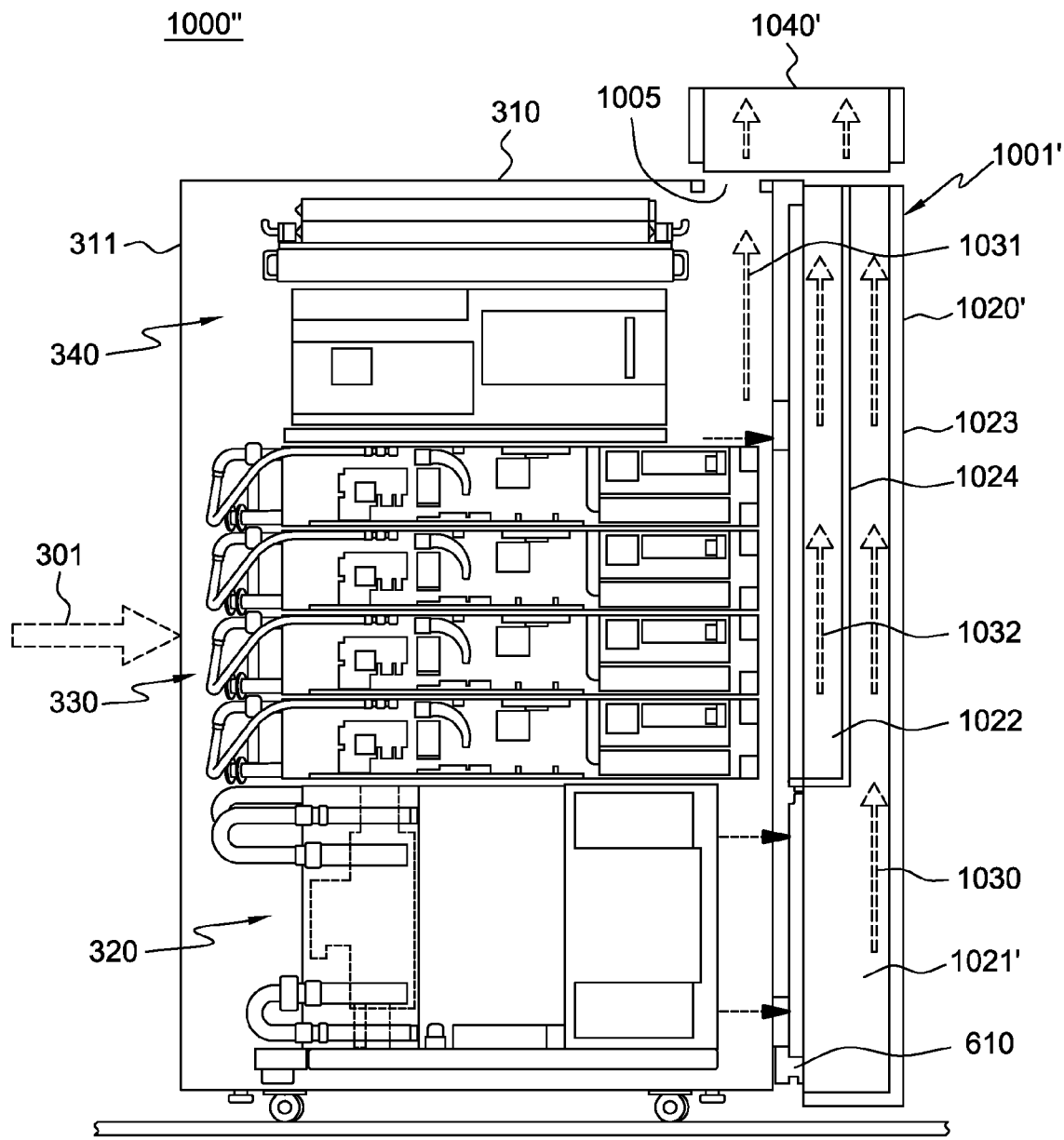
FIG. 10C depicts a further alternate embodiment of the apparatus of FIG. 10A, in accordance with one or more aspects of the present invention.

FIGS. 10A-10C depict further variations on a changeable cover assembly, in accordance with one or more aspects of the present invention.

Referring first to the embodiment of FIG. 10A, an apparatus 1000 is illustrated which includes, by way of example, electronics rack 310 of FIG. 3 and a changeable cover assembly 1001. Changeable cover assembly 1001 is sized to cover, at least in part, air outlet side 312 of electronics rack 310. In one or more implementations, changeable cover assembly 1001 substantially completely covers the air outlet side of electronics rack 310, and may be configured, for instance, as a door assembly to be hingedly mounted to the electronics rack, as in certain of the embodiments described above. In the implementation of FIG. 10A, changeable cover assembly 1001 includes a frame 610, such as described above in connection with FIGS. 7A-7C, and a vent cover 1020 which is configured to detachably couple to frame 610 so as to be, for instance, readily reversible to direct egressing airflow 1030 either upwards, as shown in FIG. 10A, or downwards, in an alternate data center implementation, where egressing airflow is exhausted through one or more air exhaust plenums located below the electronics rack 310.

As depicted, vent cover 1020 defines (in the example of FIG. 10A) an air exhaust plenum 1021 which redirects the exhausting airflow from electronics rack 310 substantially 90° to exit via an overhead airflow exhaust chimney 1040, which may, in one embodiment, be disposed in close proximity to changeable cover assembly 1001, or be coupled to the changeable cover assembly so as to form, for instance, an air-tight seal. Note that the cover assembly is changeable by, for example, changing the orientation of the vent cover 1020, or alternatively, by changing the vent cover itself, for instance, to an embodiment such as depicted in FIG. 10C.

In FIG. 10B, an apparatus 1000' is depicted, which includes electronics rack 310 and changeable cover assembly 1001. In this embodiment, electronics rack 310 is provided with an opening 1005 in an upper surface thereof to allow for a portion 1031 of the egressing airflow to directly exit from electronics rack 310 into an enlarged, overhead airflow exhaust chimney 1040'. As in the embodiment of FIG. 10A, overhead airflow exhaust plenum 1040' may be disposed in close proximity to electronics rack 310 and changeable cover assembly 1001, or alternatively, may be coupled thereto to establish an air-tight seal between the chimney and electronics rack 310 and changeable cover assembly 1001. This configuration may be advantageous with an electronics rack 310 such as described above in connection with FIG. 3, wherein a lower volume of airflow egresses from the uppermost region of the electronics rack compared to, for instance, the central and lowermost regions. With the higher rate of airflow exhausting from the central and lower regions, airflow 1031 exhausting from the upper region of electronics rack 310 could be inhibited by a strong exhausting airflow 1030 within airflow exhaust plenum 1021 of vent cover 1020.

FIG. 10C depicts a further embodiment of an apparatus 1000", in accordance with one or more aspects of the present invention. As shown, apparatus 1000' is similar to that described above in connection with FIG. 10B, with the exception that the changeable cover assembly 1001' includes a vent cover 1020' which comprises an outer vent cover 1023 and an inner vent cover 1024 defining an outer air exhaust plenum 1021' and an inner air exhaust plenum 1022, respectively. In this manner, airflow 1030 exhausting from the lowermost region 320 of electronics rack 310 may be redirected to pass through outer air exhaust plenum 1021', and be substantially isolated from the higher airflow exiting from the central region 330 of the electronics rack 310, that is, in the rack embodiment described herein by way of example. As illustrated, air exhaust 1032 exiting from the central region of electronics rack 310 is redirected within the inner air exhaust plenum 1022 to exit towards the overhead airflow exhaust chimney 1040' of the data center housing apparatus 1000". As with the changeable cover assembly 1001 embodiment of FIGS. 10A & 10B, changeable cover assembly 1001' may be, for instance, reversed to redirect airflow exhausting from the electronics rack in a downward manner, depending upon the data center's airflow exhaust configuration. Further, as with the changeable cover assembly embodiments described above, one or more surfaces of the changeable cover assembly, for instance, one or more surfaces of vent covers 1023, 1024 may comprise an acoustically-absorptive material (not shown) to attenuate noise emanating from the electronics rack through the air outlet side of the electronics rack.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. An apparatus comprising:
   a changeable cover assembly sized to cover, at least in part, an air outlet side of an electronics rack, the changeable cover assembly facilitating redirecting and venting airflow passing therethrough egressing from the air outlet side of the electronics rack, and the changeable cover assembly comprising:
      a frame with at least one opening through which air egressing from the air outlet side of the electronics rack passes;
      multiple different types of vent covers coupled to the frame and overlying, at least in part, the at least one opening in the frame to facilitate redirecting and venting the air passing therethrough, one vent cover of the multiple different types of vent covers being changeable to change a direction of vented air egressing from the changeable cover assembly, and an other vent cover of the multiple different types of vent covers directing at least two egressing airflow streams passing through the other vent cover to intersect upon being vented from the other vent cover to reduce momentum of the at least two egressing airflow streams; and
      wherein the changeable cover assembly further comprises at least one electromagnetic compatibility screen within the at least one opening in the frame, the multiple vent covers overlying the at least one electromagnetic compatibility screen.

2. The apparatus of claim 1, wherein the one vent cover is a reversible vent cover and is coupled to the frame at the air outlet side of the electronics rack above the other vent cover.

3. The apparatus of claim 2, wherein the one vent cover comprises multiple fixed louvers facilitating redirecting of the air passing through the at least one opening in the frame, the multiple fixed louvers having, at least in part, a common orientation relative to the frame with the at least one opening.

4. The apparatus of claim 3, wherein the changeable cover assembly is sized to substantially cover the air outlet side of the electronics rack.

5. The apparatus of claim 1, wherein the frame isolates airflow passing through the one vent cover from airflow passing through the other vent cover.

6. The apparatus of claim 1, wherein the one vent cover and the other vent cover of the multiple different types of vent covers are differently-sized.

7. The apparatus of claim 1, wherein each vent cover of the multiple different types of vent covers receives a respective portion of the air passing through the at least one opening in the frame.

8. An apparatus comprising:
- an electronics rack, the electronics rack comprising an air inlet side and an air outlet side; and
- a changeable cover assembly coupled to the electronics rack at the air outlet side thereof, the changeable cover assembly facilitating redirecting and venting airflow passing therethrough egressing from the air outlet side of the electronics rack, the changeable cover assembly comprising:
  - a frame with at least one opening through which air egressing from the air outlet side of the electronics rack passes;
  - multiple different types of vent covers coupled to the frame and overlying, at least in part, the at least one opening in the frame to facilitate redirecting and venting the air passing therethrough, one vent cover of the multiple different types of vent covers being changeable to change a direction of vented air egressing from the changeable cover assembly, and an other vent cover of the multiple different types of vent covers directing at least two egressing airflow streams passing through the other vent cover to intersect upon being vented from the other vent cover to reduce momentum of the at least two egressing airflow streams; and
  - wherein the changeable cover assembly is sized to substantially cover the air outlet side of the electronics rack, and the frame is a door frame hingedly mounted to the electronics rack at the air outlet side thereof, and wherein the multiple different types of vent covers comprise an acoustically absorptive material, the acoustically absorptive material being selected to attenuate noise emanating from the electronics rack through the at least one opening in the frame when the changeable cover assembly is coupled to the air outlet side of the electronics rack.

9. The apparatus of claim 8, wherein the one vent cover is a reversible vent cover and is coupled to the frame at the air outlet side of the electronics rack above the other vent cover, and comprises multiple fixed louvers having, at least in part, a common orientation relative to the frame, the multiple fixed louvers redirecting the air passing through the at least one opening in the frame.

10. A method comprising:
- providing a changeable cover assembly sized to cover, at least in part, an air outlet side of an electronics rack, the changeable cover assembly, when positioned at the air outlet side of the electronics rack, facilitating redirecting and venting airflow passing therethrough egressing from the air outlet side of the electronics rack, the providing including:
  - providing a frame with at least one opening through which air egressing from the air outlet side of the electronics rack passes;
  - providing multiple different types of vent covers coupled to the frame and overlying, at least in part, the at least one opening in the frame to facilitate redirecting and venting the air passing therethrough, one vent cover of the multiple different types of vent covers being changeable to change a direction of vented air egressing from the changeable cover assembly, and an other vent cover of the multiple different types of vent covers directing at least two egressing airflow streams passing through the other vent cover to intersect upon being vented from the other vent cover to reduce momentum of the at least two egressing airflow streams; and
- providing the changeable cover assembly further comprises providing at least one electromagnetic compatibility screen within the at least one opening in the frame, the multiple vent covers overlying the at least one electromagnetic compatibility screen.

\* \* \* \* \*